(12) United States Patent
Fan et al.

(10) Patent No.: US 12,176,228 B2
(45) Date of Patent: Dec. 24, 2024

(54) HIGH DENSITY SEMICONDUCTOR STORAGE SYSTEM

(71) Applicant: Taiwan Semiconductor Manufacturing Co., Ltd., Hsinchu (TW)

(72) Inventors: Rong Syuan Fan, Hsinchu (TW); Ching-Jung Chang, Hsinchu (TW); Chi-Feng Tung, Hsinchu (TW); Hsiang Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 314 days.

(21) Appl. No.: 17/725,120

(22) Filed: Apr. 20, 2022

(65) Prior Publication Data

US 2023/0343621 A1    Oct. 26, 2023

(51) Int. Cl.
*H01L 21/673* (2006.01)
*H01L 21/67* (2006.01)
*H01L 21/677* (2006.01)

(52) U.S. Cl.
CPC .... *H01L 21/67309* (2013.01); *H01L 21/6719* (2013.01); *H01L 21/67346* (2013.01); *H01L 21/67736* (2013.01)

(58) Field of Classification Search
CPC ......... H01L 21/67346; H01L 21/67309; H01L 21/67769; H01L 21/67775; H01L 21/67778; H01L 21/67766; H01L 21/68707; B65G 1/0435
See application file for complete search history.

(56) References Cited

U.S. PATENT DOCUMENTS

| | | | |
|---|---|---|---|
| 11,460,766 B2* | 10/2022 | Sasaki | H01L 21/67736 |
| 2003/0031545 A1 | 2/2003 | DeMarco et al. | |
| 2003/0129051 A1 | 7/2003 | Friedman et al. | |
| 2009/0222135 A1 | 9/2009 | Asakawa et al. | |
| 2014/0322919 A1 | 10/2014 | Stafford et al. | |
| 2018/0076059 A1* | 3/2018 | Abe | H01L 21/67775 |
| 2018/0076074 A1* | 3/2018 | Abe | H01L 21/67775 |
| 2019/0048980 A1* | 2/2019 | Muser | B66F 9/141 |
| 2021/0118714 A1* | 4/2021 | Raga-Barone | G03F 7/70741 |
| 2021/0272837 A1* | 9/2021 | Kuo | H01L 21/67271 |
| 2022/0037184 A1* | 2/2022 | Taniyama | H01L 21/68707 |
| 2024/0014062 A1* | 1/2024 | Hitomi | H01L 21/67769 |
| 2024/0112929 A1* | 4/2024 | Suzuki | H01L 21/681 |

* cited by examiner

*Primary Examiner* — Kaitlin S Joerger
(74) *Attorney, Agent, or Firm* — Seed IP Law Group

(57) ABSTRACT

The present disclosure is directed to a stocker utilizing one or more storage carriers to optimize the utilization of a storage compartment within the stocker. The stocker includes one or more storage towers each including one or more shelves that may be moved from a closed position to an opened position by being pulled outward by a hook of a forking structure. This forking structure is configured to lift up a corresponding storage carrier off the shelf to be transported to a storage carrier load port to position one or more workpieces or toolpieces within the storage carrier, which is then transported back to the corresponding shelf for storage. The utilization of the forking structure along with the pull out shelves allows for a large number of storage carriers to be stored within the storage compartment of the stocker.

20 Claims, 14 Drawing Sheets

HIGH DENSITY SEMICONDUCTOR STORAGE SYSTEM

BACKGROUND

Generally, fabrication of integrated circuits is typically accomplished by performing a large number of processing steps on workpieces (e.g., a semiconductor or silicon wafers). These processing steps typically result in the formation of a large number of conductive structures, such as transistors, in highly complex arrangements in conjunction with a substrate (e.g., semiconductor or silicon). These processing steps also result in the formation of dielectric layers, metal interconnects, vias, plugs, and other integrated circuit structures and components.

Generally, in the manufacture of electrical or semiconductor devices, robots are often utilized to transfer the workpieces between various processing apparatuses such as processing tools. When not being processed, these workpieces may be stored in a storage system, such as a stocker, containing an enclosed environment in which certain environmental qualities are maintained, monitored, and controlled. For example, these environmental qualities may include humidity, air quality (e.g., debris, pollutants, particles, contaminants, etc.), or other like environmental qualities that may be maintained, monitored, or controlled within the storage system. By maintaining, controlling, and monitoring these environmental qualities within the enclosed environment the quality of the workpieces stored within the storage system is maintained avoiding deterioration of the workpieces.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
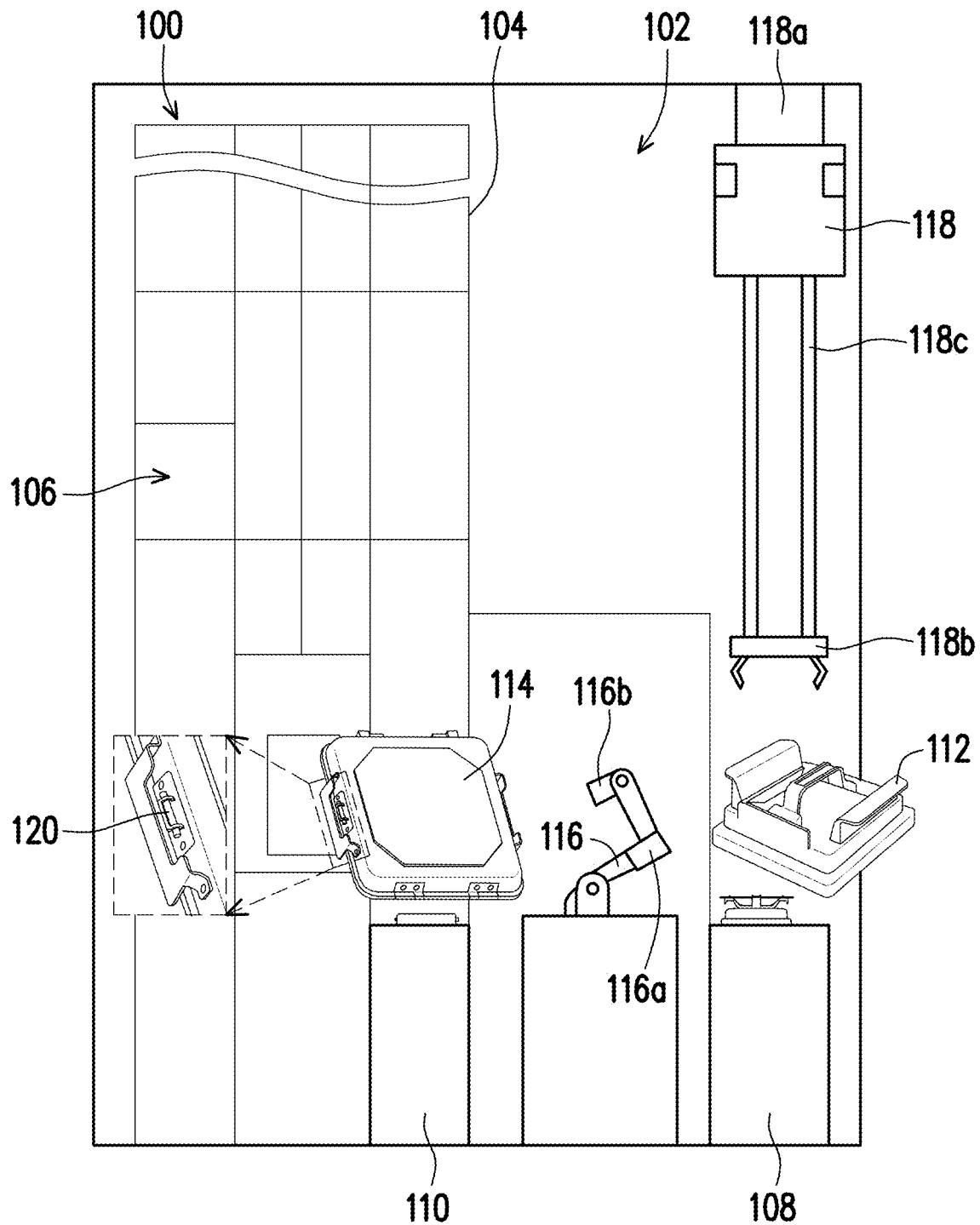
FIG. 1A is a schematic view illustrating an example of a stocker and internal components within the stocker, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," "lateral," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view illustrating an example of a storage system 100, in accordance with some embodiments of the present disclosure. The storage system 100 may be referred to as a stocker 100 herein. A plurality of workpieces or toolpieces are stored within the stocker 100 when not being processed or utilized within a semiconductor plant (FAB), which similarly may be referred to as a semiconductor factory, foundry, or some other location that manufactures semiconductor devices such as integrated circuits, chips, or some other similar or like types of semiconductor devices. The stocker 100 may store workpieces such as wafers (e.g., semiconductor, silicon, or some other similar or like type of wafer), toolpieces such as EUV (extreme ultraviolet) reticles for EUV photolithography processing, or some other similar or like type of workpieces or toolpieces that may need to be stocked within an enclosed environment in which environmental qualities are controlled to maintain the quality of the workpieces or toolpieces stored within the stocker 100 when not in use.

The stocker 100 is within an external environment 102 that is external to a housing 104 of the stocker 100. The housing 104 separates a storage compartment 106, which is an internal compartment within the housing 104, from the external environment 102 outside the housing 104. The stocker 100 further includes a production carrier load port 108 that is accessible from the external environment 102, and a storage carrier load port 110 that is within the storage compartment 106 of the stocker 100. In other words, the storage carrier load port 110 is within the housing 104 of the stocker 100, and the production carrier load port 108 is accessible from external environment 102.

Figure 2A:
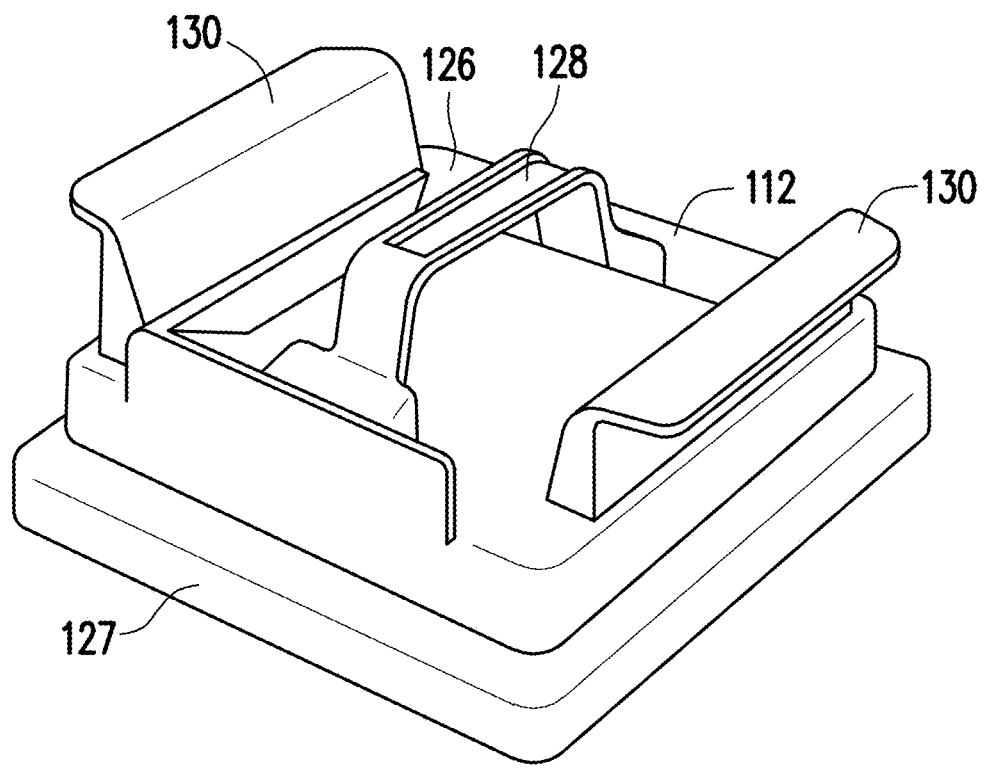
FIG. 2A is a perspective view illustrating an example of a production carrier.
Figure 2B:
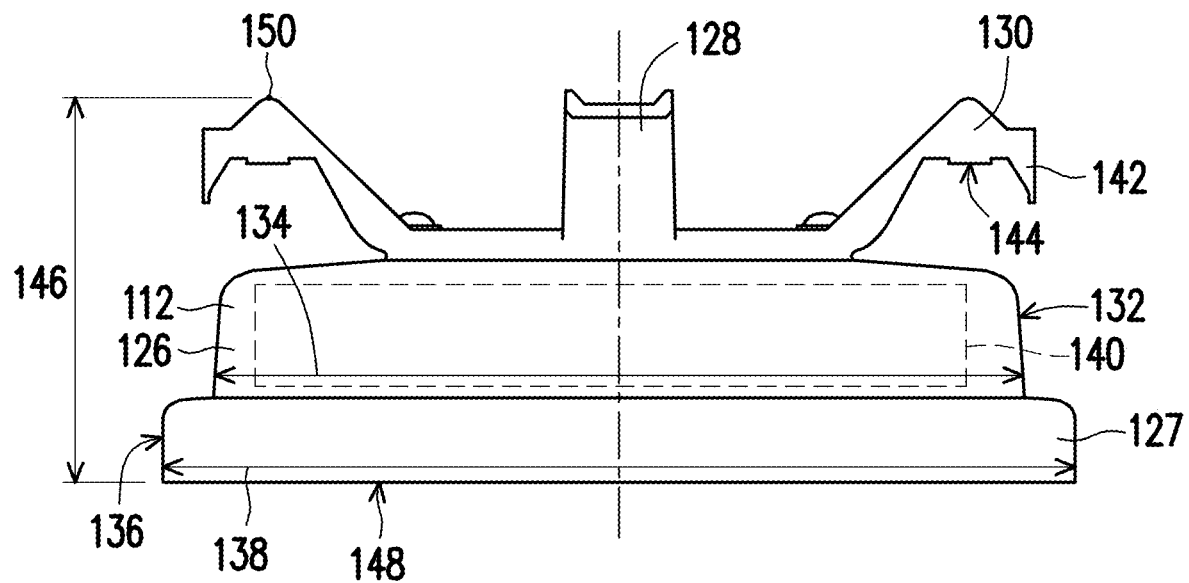
FIG. 2B is a side view illustrating the example of the production carrier as shown in FIG. 2A.
Figure 3A:
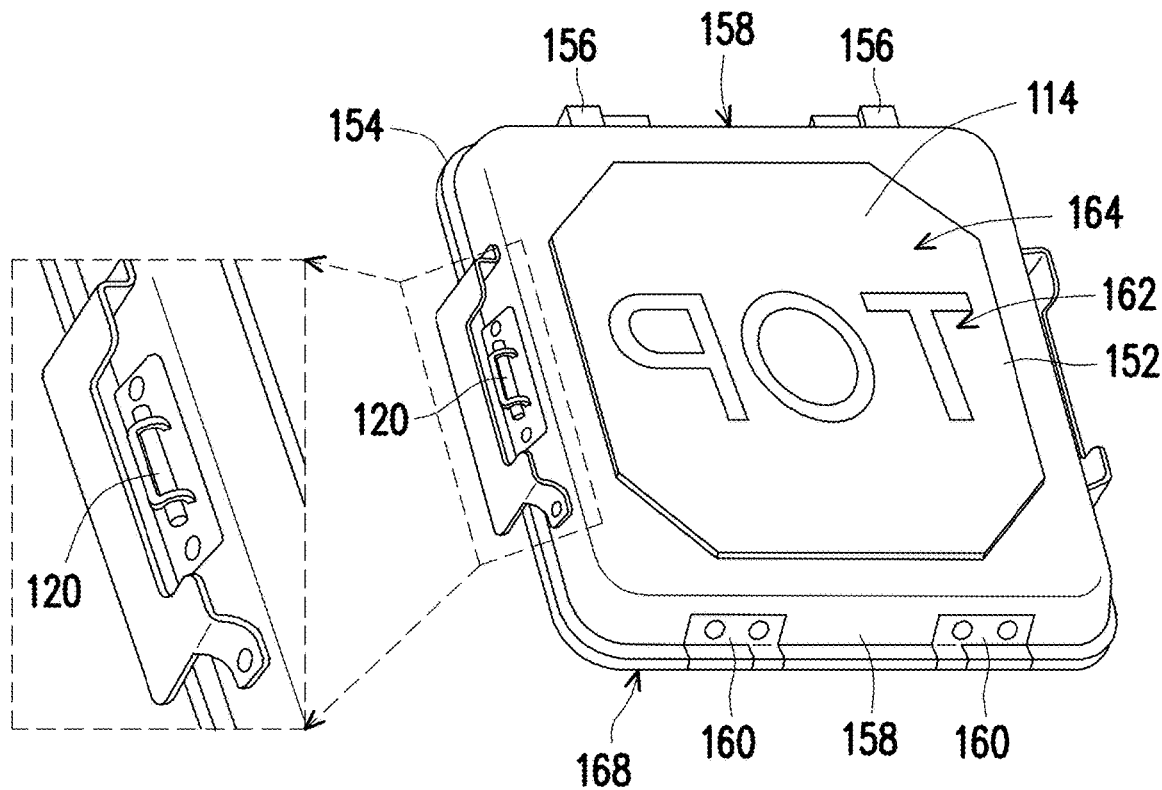
FIG. 3A is a perspective view illustrating an example of a storage carrier, in accordance with some embodiments of the present disclosure.
Figure 3B:
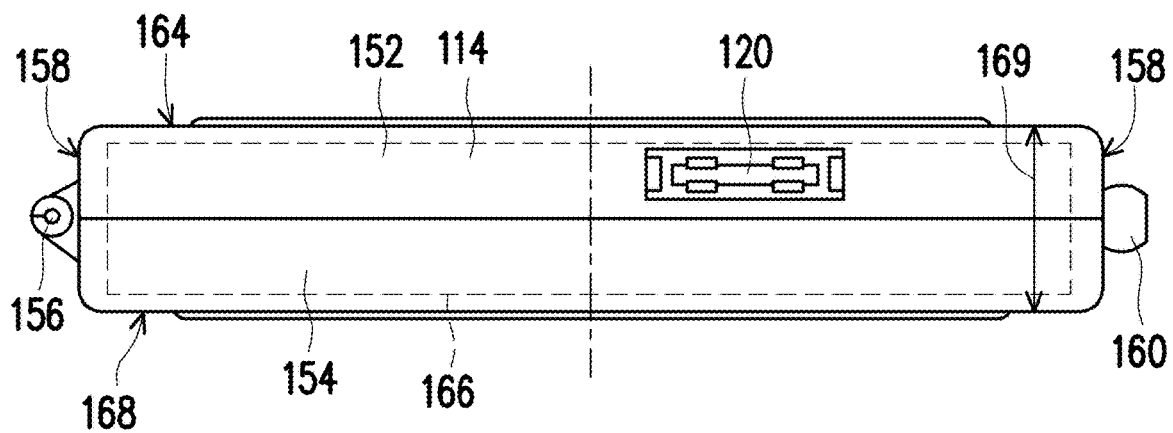
FIG. 3B is a side view illustrating an example of the storage carrier as shown in FIG. 3A, in accordance with some embodiments of the present disclosure.

The production carrier load port 108 is configured to receive a production carrier 112 as shown in FIGS. 2A and 2B, and the storage carrier load port 110 is configured to receive a storage carrier 114 as shown in FIGS. 3A and 3B. The details of the production carrier 112 will be discussed later herein with respect to FIGS. 2A and 2B, and the details of the storage carrier 114 will be discussed in further detail with respect to FIGS. 3A and 3B. Both the production carrier 112 and the storage carrier 114 are configured to contain workpieces or toolpieces such as silicon wafers, semiconductor wafers, EUV (extreme-ultraviolet) reticles utilized for EUV lithography, or some other similar or like type of workpieces or toolpieces that are to be stored within the stocker 100.

A carrier exchange 116 is within the housing 104 and is between the production carrier load port 108 and the storage carrier load port 110. The carrier exchanger 116 is configured to access the production carrier load port 108 and the storage carrier load port 110 to transfer workpieces or toolpieces between the production carrier 112 and the storage carrier 114, respectively. For example, as shown in FIG. 1A, the carrier exchanger 116 includes a robotic arm 116a with an end effector 116b at an end of the robotic arm 116a. For example, the end effector 116b may be a gripper, a suction cup end effector, an air suction end effector, or some other similar or like type of end effector that may be utilized to transfer workpieces or toolpieces between the production carrier 112 and the storage carrier 114 and vice versa.

A production carrier transport system 118 is configured to transport the production carrier 112 to and from the stocker 100. The production carrier transport system 118 includes a transport rail or track 118a and a transport end effector 118b that is at an end of a lift structure 118c. The lift structure 118c moves the end effector 118b upwards and downwards to transport the production carrier 112 to and from tool components or apparatuses that may be utilized to refine and process the workpieces or utilize the toolpieces that are transported within the production carrier 112. These tool components and apparatuses may be extreme ultraviolet (EUV) lithography tool apparatuses, etching tool apparatuses, pick and place tool apparatuses, or some other similar or like type of processing tool components and apparatuses in the external environment 102, which again may be a semiconductor factory (e.g., FAB). For example, the end effector 118b may be a gripper, a suction cup end effector, an air suction end effector, or some other similar or like type of end effector.

In at least one instance, the production carrier transport system 118 picks up the production carrier 112 with the end effector 118b at a location within the external environment 102 spaced away from the stocker 100. The lifting structure 118c then retracts upwards raising the production carrier 112 towards the transport rail 118a. The lifting structure 118c then moves along the transport rail 118a while holding the production carrier 112 transporting the production carrier 112 to the stocker 100. Once aligned with the production carrier load port 108, the lifting structure 118c expands downwards and moves the production carrier 112 downwards to the production carrier load port 108. Once on or at the production carrier load port 108, the production carrier 112 may be released by the end effector 118b. Once on or at the production carrier load port 108, the production carrier 112 is opened providing access to the workpieces or toolpieces (not shown) within an internal compartment 140 (see FIG. 2B) of the production carrier 112 such that the carrier exchanger 116 may access the workpieces or toolpieces within the internal compartment 140 of the production carrier 112.

Figure 6A:
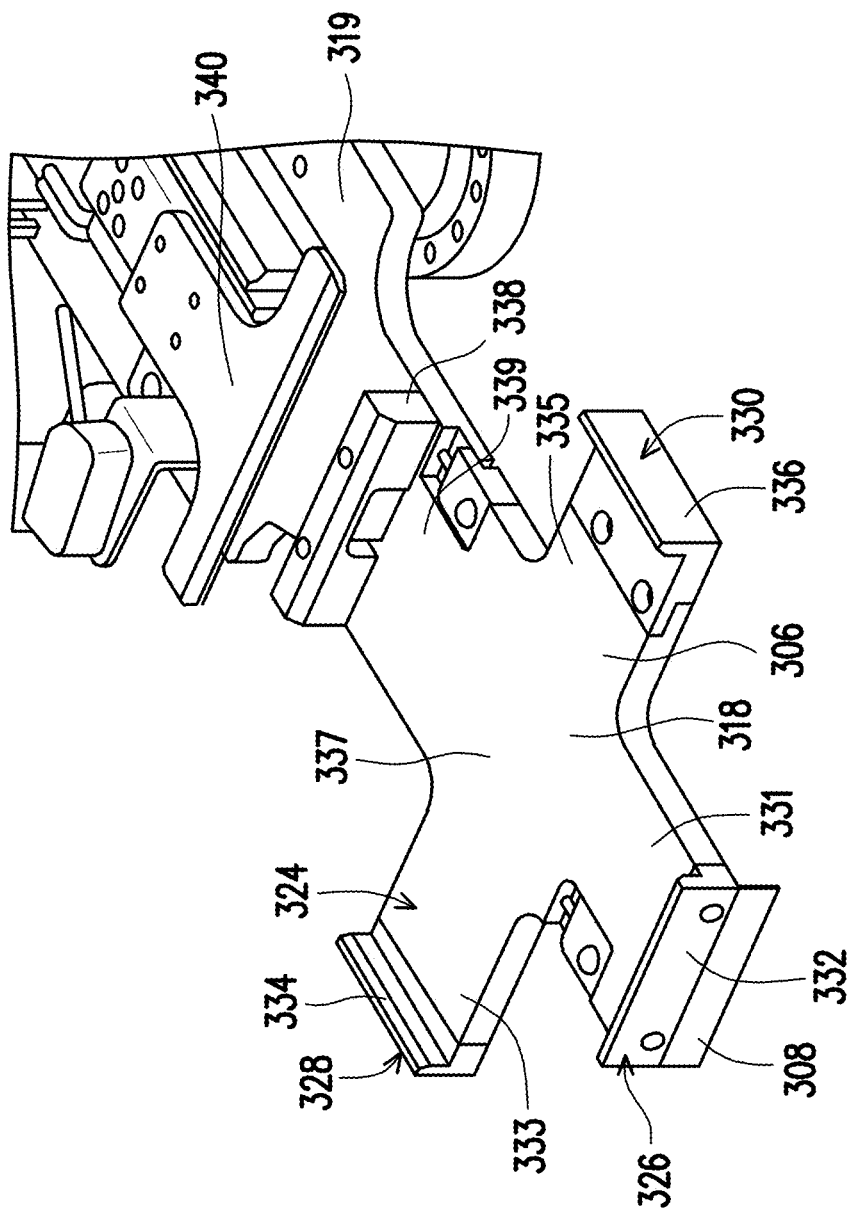
FIG. 6A is a perspective view of a forking structure of a forking robot within the stocker as shown in FIG. 1A without a storage carrier on the forking structure, in accordance with some embodiments of the present disclosure.
Figure 6B:
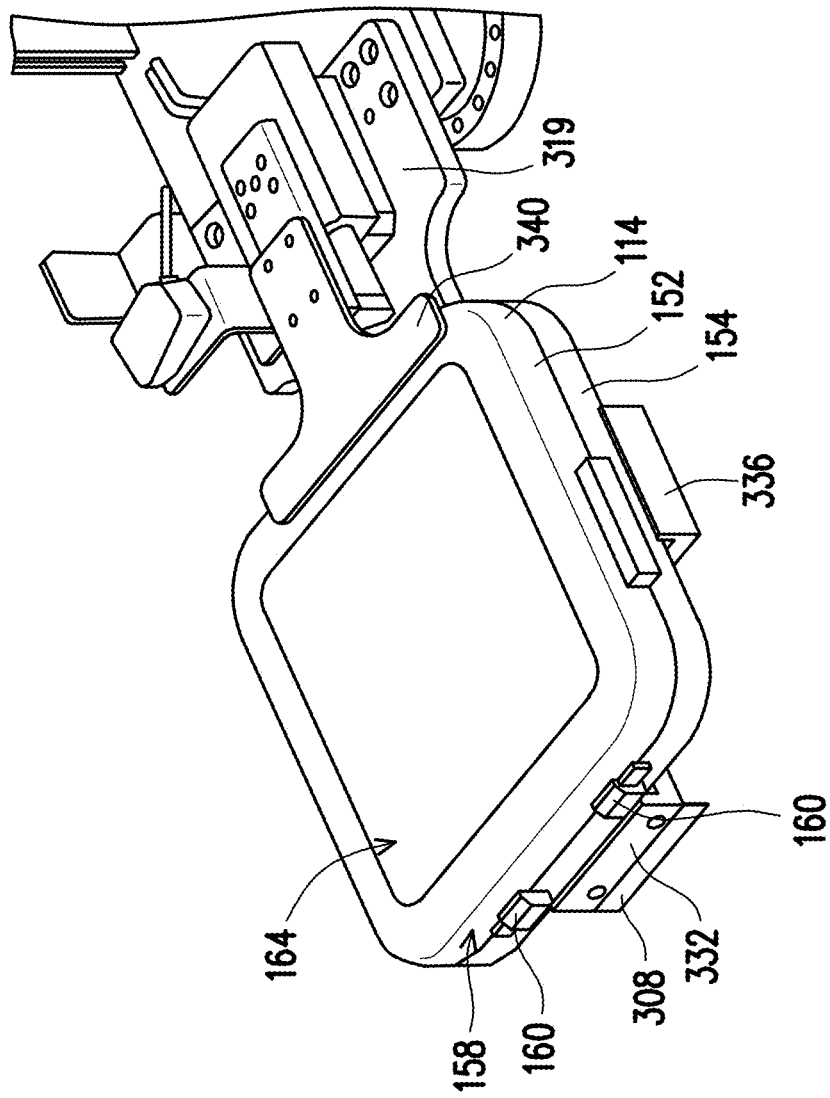
FIG. 6B is a perspective view of the forking structure of the forking robot with the storage carrier on the forking structure, in accordance with some embodiments of the present disclosure.

The storage carrier 114 is transported within the storage compartment 106 of the housing 104 of the stocker 100 to the storage carrier load port 110. The storage carrier 114 is then opened once on or at the storage carrier load port 110 such that the carrier exchanger 116 may access an internal compartment 166 of the storage carrier 114. For example, the storage carrier 114 may be transported to and from the storage carrier load port 110 by a forking structure 306 as shown in FIGS. 6A and 6B of the present disclosure. The forking structure 306 is at an end of a forking robot (not entirely shown). The details of this forking structure 306 of the forking robot (not entirely shown) will be discussed in detail with respect to FIGS. 6A and 6B herein.

In some embodiments, the production carrier 112 and the storage carrier 114 may be opened and closed by the end effector 116b of the carrier exchanger 116. In some embodiments, the production carrier load port 108 may have an opening and closure structure that opens the product carrier 112 when positioned on or at the production carrier load port 108 by the production carrier transport system 118 and closes the production carrier 112 when the production carrier transport system 118 moves the production carrier 112 away from the production carrier load port 108. In some embodiments, the storage carrier load port 110 may have an opening and closure structure that opens the storage carrier 114 when positioned on or at the storage carrier load port 110 by the forking structure 306 and closes the storage carrier 114 when the forking structure 306 moves the storage carrier 114 away from the storage carrier load port 110.

After the storage carrier 114 is at or on the storage carrier load port 110, the production carrier 112 is at or on the production carrier load port 108, and both the storage carrier 114 and the production carrier 112 are opened, the end effector 116b of the carrier exchanger 116 is utilized to pick up the one or more workpieces or toolpieces within the internal compartment 140 of the production carrier 112 and place them within the internal compartment 166 of the storage carrier 114. In other words, the one or more workpieces or toolpieces within the internal compartment 140 of the production carrier 112 are transferred to the internal compartment 166 of the storage carrier 114. After the one or more workpieces or toolpieces are positioned within the internal compartment 166 of the storage carrier 114, the storage carrier 114 and the production carrier 112 are closed such that the internal compartment 166 of the storage carrier 114 contains the one or more workpieces or toolpieces, and the internal compartment 140 of the production carrier 112 is empty or contains fewer workpieces or toolpieces before the transferring of at least some of these workpieces or toolpieces into the internal compartment 166 of the storage carrier 114.

Once the storage carrier 114 is filled or partially filled with the workpieces or toolpieces, the storage carrier 114 is moved away from the storage carrier load port 110 to a location within the storage compartment 106 within the stocker 100. For example, the storage carrier 114 is moved within the storage compartment 106 to and from the storage carrier load port 110 by the forking structure 306 as shown in FIGS. 6A and 6B. The above discussed opening and closure structures at the production carrier load port 108 and the storage carrier load port 110, respectively, may be automated opening and closure structures, automatic opening and closure structures, or some other similar or like type of opening and closure structure that opens and closes the production carrier 112 and the storage carrier 114 when the production carrier 112 and the storage carrier 114 are present at the production carrier load port 108 and the storage carrier load port 110, respectively.

As shown in FIG. 1A, the storage carrier 114 includes an RFID (radio frequency identification) structure 120 on a side surface of the storage carrier 114. The RFID structure 120 may be scanned by an RFID scanner, which may be within the storage compartment 106 of the stocker 100. The RFID structure 120 may be scanned by the RFID scanner when the storage carrier 114 is moved to and from the storage carrier load port 110 to track and record data related to the one or more workpieces and toolpieces inserted into or removed from the internal compartment 166 of the storage carrier 114. This RFID structure 120 allows for the one or more workpieces and toolpieces to be tracked when present within the internal compartment 166 of the storage carrier 114 and stored within the stocker 100. This tracking information may be readily accessed through utilization of a memory, a controller (e.g., computer, CPU, processor, etc.), or some other similar or like types of electronic devices either alone or in combination to track the location and/or other characteristics of the one or more workpieces or toolpieces stored within the storage carrier 114 in the stocker 100. For example, a memory and a processor may be in electrical communication with the RFID scanner to record and track the one or more workpieces or toolpieces in real time.

Figure 1B:
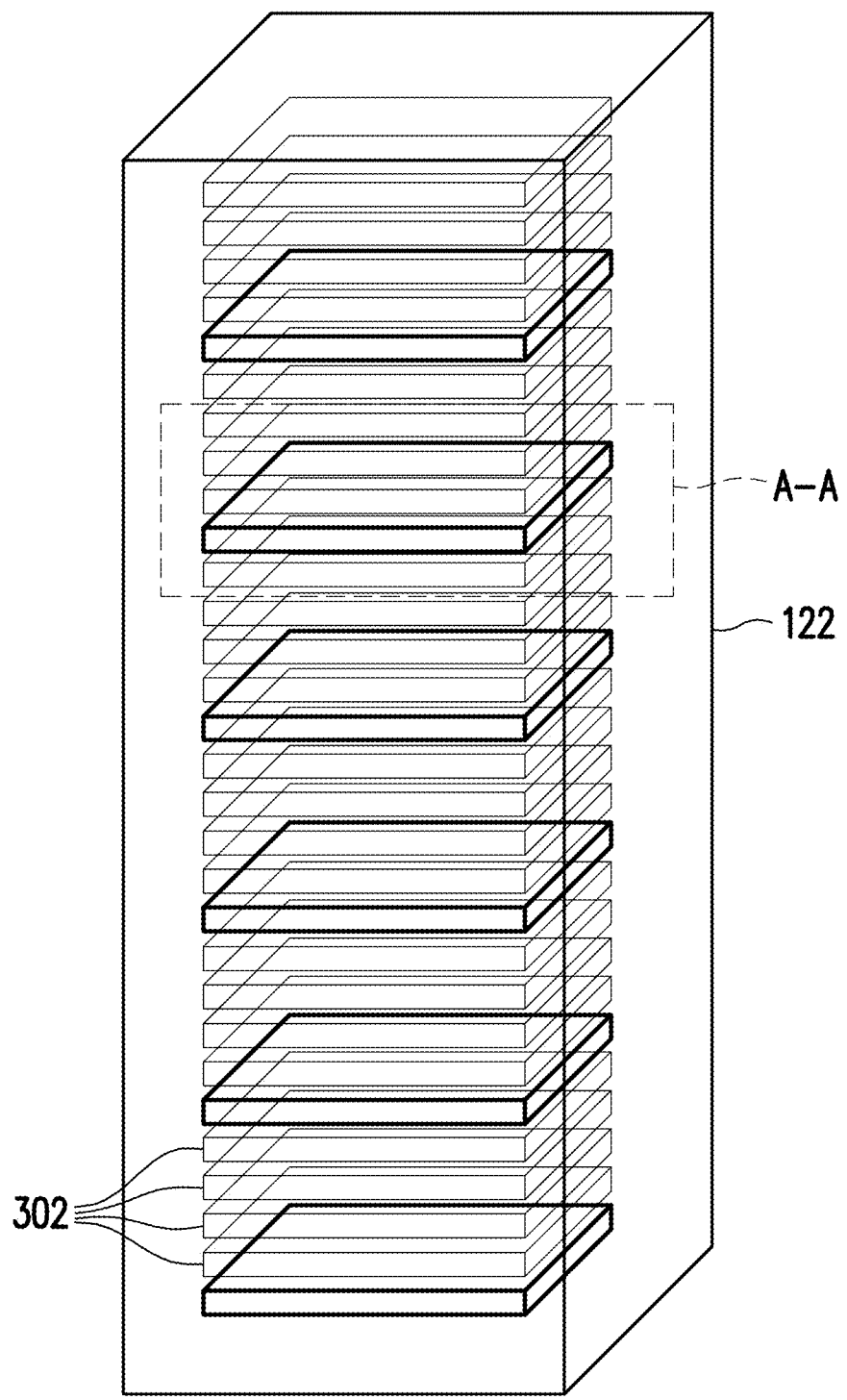
FIG. 1B is a perspective view illustrating an example of a storage tower in the stocker as shown in FIG. 1A, in accordance with some embodiments of the present disclosure.

FIG. 1B is directed to a storage tower 122 that includes a plurality of shelves 302. A plurality of the storage towers 122 may be present within the storage compartment 106 of the stocker 100 to store a plurality of the storage carriers 114 that each contain one or more workpieces or toolpieces. In other words, each one of the plurality of shelves 302 of each one of the plurality of storage towers 122 may have a corresponding one of the plurality of storage carriers 114 present on each one of the plurality of shelves 302. These storage carriers 114 may be emptied and filled utilizing the carrier exchanger 116 and the storage carrier load port 110 with the one or more workpieces or toolpieces. In other words, the plurality of shelves 302 of each one of the plurality of storage towers 122 are in a stacked configuration. The storage towers 122 may be referred to as storage columns, stacked storage configurations, or some other similar or like type of reference to the storage towers 122 having the plurality of shelves in a stacked configuration as shown in FIG. 1B.

FIGS. 2A and 2B are directed to the production carrier 112, in accordance with some embodiments of the present disclosure. FIG. 2A is a perspective view of the production carrier 112, and FIG. 2B is a side view of the production carrier 112.

As shown in FIG. 2A, the production carrier 112 includes a lid 126 and a base 127. The lid 126 is removably or hingedly coupled to the base 127 such that the internal compartment 140 within the production carrier 112 is accessible by the carrier exchanger 116 when the production carrier 112 is present on or at the production carrier load port 108. The lid 126 includes a handle 128 and one or more extensions 130. In this embodiment, the lid 126 includes a pair of the extensions 130.

As shown in FIG. 2B, the base 127 is wider than the lid 126. The lid 126 has respective sidewalls 132 and a first dimension 134 that extends between opposite ones of the respective sidewalls 132 of the lid 126. The base 127 includes respective sidewalls 136 and a second dimension 138 that extends between opposite ones of the sidewalls 136. The second dimension 138 is greater than the first dimension 134.

Each of the one or more extensions 130 includes a hook end 142 that is configured to mechanically cooperate with the end effector 118b of the production carrier transport system 118. For example, when the end effector 118b is a gripper as shown in FIG. 1A, a finger of the gripper may wrap around the hook end 142 and physically contact a surface 144 of the corresponding extension 130 of the one or more extensions 130. Each one of the one or more extensions 130 includes a hook end 142 and a surface 144.

The production carrier 112 further includes a third dimension 146 that is transverse to the first dimension 134 and the second dimension 138. The third dimension 146 extends from a surface 148 of the base 127 that faces away from the lid 126 to an upper point 150 of the production carrier 112. In this embodiment, the third dimension 146 is less than the first dimension 134 and is less than the second dimension 138. The third dimension 146 may extend in a direction perpendicular or orthogonal to a direction in which the first dimension 134 extends and a direction in which the second dimension 138 extends.

The internal compartment or cavity 140 is present between the lid 126 and the base 127 and is delimited by the lid 126 and the base 127. In other words, the internal compartment or cavity 140 may be delimited by respective inner surfaces (not shown) of the lid 126 and the base 127. As discussed above, the one or more workpieces or toolpieces may be present within the internal compartment 140 when transporting the production carrier 112 to and from the production carrier load port 108 of the stocker 100 with the production carrier transport system 118.

In some embodiments, the lid 126 may be coupled to a cassette that contains several more workpieces or toolpieces relative to the production carrier 112 as shown in FIGS. 2A and 2B. For example, the lid 126 would be coupled to an end of the cassette enclosing the workpieces or toolpieces within an internal compartment delimited by the cassette and the lid 126. The end effector 118b of the production carrier transport system 118 would mechanically cooperate (e.g., hold onto or grip) with the handle 128 or the extensions 130 to lift or move the production carrier 112 to and from the production carrier load port 108.

FIGS. 3A and 3B are directed to the storage carrier 114, in accordance with embodiments of the present disclosure. FIG. 3A is a top plan perspective view of the storage carrier 114. FIG. 3B is a side view of the storage carrier 114. As shown in FIGS. 3A and 3B, the storage carrier 114 is shown in a closed position such that the internal compartment 166 of the storage carrier 114 is closed off.

As shown in FIG. 3A, the storage carrier 114 includes a lid 152 and a base 154 that are hingedly coupled together through one or more hinges 156. The storage carrier 114 includes respective sides 158. The lid 152 and the base 154 may be held together in a closed position by one or more closure structures 160 present at one of the respective sides 158 of the storage carrier 114. For example, the one or more hinges 156 are a first side of the respective sides 158 that is opposite to a second side of the respective sides 158 that is opposite to the first side, and the one or more closure structures 160 are present at the second side. In some embodiments, closure structures 160 may also be present on transverse sides of the respective sides 158 that are transverse to the first side and the second side.

In some embodiments, the closure structures 160 may be snap closure structures including a first snap structure on the lid 152 that interlocks with a second snap structure on the base 154. For example, the first snap structure may be a male snap structure and the second snap structure may be a female snap structure such that the male snap structure is inserted into the female snap structure and interlocks with the female snap structure locking the lid 126 to the base 127. However, in some alternative embodiments, the first snap closure structure may be a female structure and the second snap closure structure is a female structure. In other words, the lid 126, the base 127, and the closure structures 160 may be the same or similar to a snap closure clamshell container.

In some embodiments, the closure structures 160 may be some other closure structure such as a pin and lock structure, a latch lock structure, a lever lock structure, or some other similar or like type of temporary lock structure that interlocks the lid 152 with the base 154 such that the lid 152 and the base 154 enclose the internal compartment 166 in the storage carrier 114. As discussed earlier, the internal compartment 166 of the storage carrier 114 may contain one or more workpieces such as a wafer, a silicon wafer, a semiconductor wafer, or some other similar or like types of workpieces, or the internal compartment 166 of the storage carrier may contain one or more toolpieces such as an EUV (extreme ultraviolet) reticle or some other similar or like types of toolpieces. These workpieces or toolpieces are stored within the storage carrier 114 within the stocker 100 when these workpieces or toolpieces are not being utilized by tool apparatuses of the semiconductor manufacturing facility or factory (FAB).

The storage carrier 114 may be opened by unlocking the closure structures 160 and rotating the lid 152 about the one or more hinges 156 in a first rotation direction rotating the lid 152 away from the base 154. This rotation of the lid 152 in the first rotation direction away from the base 154 rotates the lid 152 from a closed position to an opened position such that the carrier exchanger 116 may access the internal compartment 166 within the storage carrier 114. In some embodiments, the carrier exchanger 116 may be utilized to open the storage carrier 114 or assist in opening the storage carrier 114. For example, the end effector 116b at the end of the robotic arm 116a of the carrier exchanger 116 may unlock the closure structures 160 and then rotate the lid 152 in the first rotation direction to move the lid 152 from the closed position to the opened position.

The storage carrier 114 may be closed by rotating the lid 152 about the one or more hinges 156 in a second rotation direction rotating the lid 152 towards the base 154. This rotation of the lid 152 in the second rotation direction rotates the lid 152 towards the base and rotates the lid 152 from the opened position to the closed position. In some embodiments, the carrier exchanger 116 may be utilized to close the storage carrier 114 or assist in closing the storage carrier 114. For example, the end effector 116b at the end of the robotic arm 116a of the carrier exchanger 116 may rotate the lid 126 in the second rotation direction towards the base 154 to move the lid 152 from the opened position to the closed position, and, when the lid 152 is rotated to the fully closed position, the closure structures 160 may lock the lid 152 in the closed position enclosing the internal compartment 166 within the storage carrier 114 with the lid 152 and the base 154.

As discussed earlier, the storage carrier 114 includes the RFID structure 120 at one of the respective sides 158 of the storage carrier 114. For example, in this embodiment of the storage carrier 114, the RFID structure 120 is at a third side of the respective sides 158 transverse to the first side at which the hinges 156 are present and the second side at which the closure structures 160 are present. The third side extends between the first side and the second side. The left hand image in FIG. 3A is an enhanced, zoomed in view of the RFID structure 120.

A label 162 is on a first outer surface 164 of the storage carrier 114. In this embodiment, the label 162 recites "TOP" indicating that it is a top side of the storage carrier 114. The label 162 allows for a user (e.g., maintenance employee) who may be replacing a defective storage carrier 114 in the stocker 100 with a replacement storage carrier 114 to easily determine the orientation of the replacement storage carrier 114. For example, the user is able to quickly determine the positioning that the replacement storage carrier 114 is to be placed onto a corresponding one of the plurality of shelves 302 of a corresponding one of the plurality of storage towers 122.

A second outer surface 168 of the storage carrier 114 is opposite to the first outer surface 164. While not shown, the second outer surface 168 may include a label similar or like the label 162. However, unlike the label 162 that recites "TOP," the label on the second outer surface 168 may recite "BOTTOM," such that a user of the storage carrier 114 may easily and quickly determine or discern a top side of the storage carrier 114 from the bottom side of the storage carrier 114.

As shown in FIGS. 3A and 3B, the first outer surface 164 may be an outer surface of the lid 152 and the second outer surface 168 may be an outer surface of the base 154. The first outer surface 164 may be a top or upper surface of the storage carrier 114, and the second outer surface 168 may be a bottom or lower surface of the storage carrier 114.

A dimension 169 extends from the first outer surface 164 to the second outer surface 168. The dimension 169 of the storage carrier 114 is less than the dimension 146 of the production carrier 112 as shown in FIG. 2B. The dimension 169 being less than the dimension 146 optimizes the utilization of storing the storage carriers 114 within the stocker 100 instead of storing the production carriers 112 within the stocker 100. For example, as the storage carriers 114 with the dimension 169 are thinner than the production carriers 112 with the dimension 146, the storage carriers 114 take up less space within the storage compartment 106 instead of if the production carriers 112 were stored within the stocker 100.

As shown in FIG. 3B, the closure structure 160 is in an interlocked state such that the lid 152 is locked in the closed position. When in the closed position, the lid 152 and the base 154 enclose the internal compartment 166, which is represented by a dotted rectangle in FIG. 3B. The lid 152 and the base 154 delimit the internal compartment 166 when the lid 152 is in the closed position as shown in FIGS. 3A and 3B.

Figure 4:
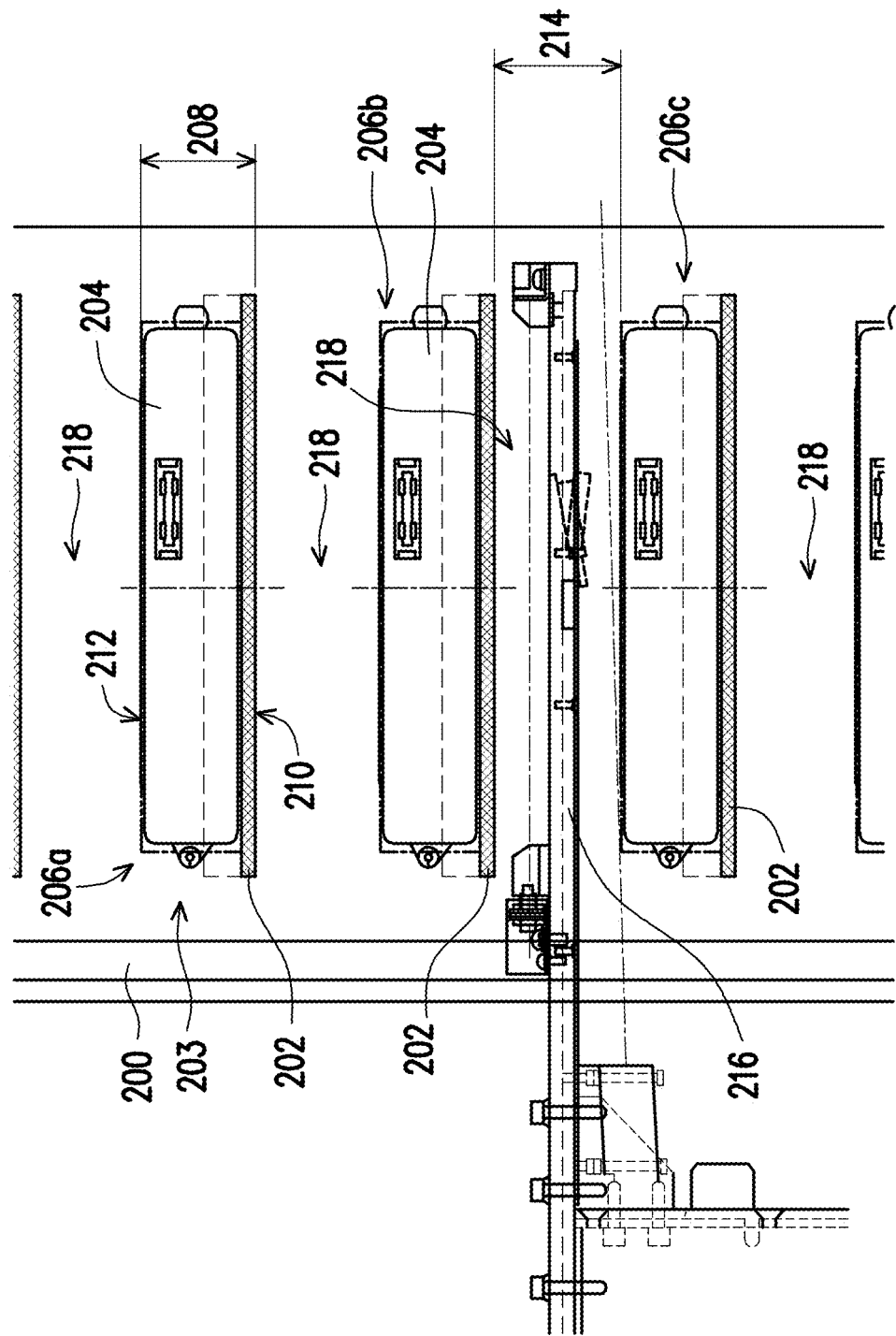
FIG. 4 is a side view of shelves within a storage system.

FIG. 4 is a side view of a storage tower 200 with shelves 202 in a stacked configuration within a storage area 203. A plurality of storage carriers 204 are in the storage area 203 of the storage tower 200. Each one of the storage carriers 204 is on a corresponding one of the shelves 202 within the storage area 203 of the storage tower 200. Each of the storage carriers 204 may contain one or more workpieces or one or more toolpieces that are stored within the storage carriers 204. Each shelf 202 and one corresponding storage carrier 204, which is on the shelf 202, may be referred together as a bin 206a, 206b, 206c. Each of the bins 206a, 206b, 206c includes a dimension 208 that extends from a lower surface 210 of the corresponding shelf 202 to an upper surface 212 of the corresponding storage carrier 204. Each of the bins 206a, 206b, 206c is within the storage area 203 of the storage tower 200.

Each of the bins 206a, 206b, 206c is spaced apart from each adjacent bin 206a, 206b, 206c by a dimension 214. As shown in FIG. 4, the bins 206a, 206b, 206c include an upper bin 206a, a central bin 206b, and a lower bin 206c. For example, the surface 210 of the corresponding shelf 202 of the central bin 206b as shown in FIG. 4 is spaced apart from the surface 212 of the corresponding storage carrier 204 of the lower bin 206c that is adjacent to the central bin 206b. In other words, the central bin 206b is above the lower bin 206c, and the lower bin 206c is below the central bin 206b. The dimension 214 is large enough to allow a forking structure 216 to enter a gap 218 with the dimension 214 between the upper bin 206a and the lower bin 206c as shown in FIG. 4. The dimension 214 of the gap 218 is approximately equal to the dimension 208 of the bins 206a, 206b, 206c. The dimension 214 is large enough to allow the forking structure 216 to enter the gaps 218 between the various bins 206a, 206b, 206c of the storage tower 200.

As shown in FIG. 4, the forking structure 216 is between the lower bin 206c and the central bin 206b. Once the forking structure 216 is in the position as shown in FIG. 4, the forking structure 216 may be moved upwards to come into contact with the corresponding storage carrier 204 of the central bin 206b and lift up the corresponding storage carrier 204 of the central bin 206b upwards and out of the corresponding shelf 202 of the central bin 206b. When lifting up on the corresponding storage carrier 204 of the central bin 206b, the corresponding storage carrier 204 may move upwards and into the gap 218 between the central bin 206b and the upper bin 206a until there is enough clearance for the corresponding storage carrier 204 and the forking structure 216 to move horizontally outward from the storage tower without physically bumping into and contacting the upper bin 206a or the corresponding shelf 202 of the central bin 206b.

The shelves 202 are fixed within the storage carrier in fixed positions such that the shelves 202 are not movable from their respective fixed positions and are instead held stationarily in their fixed positions. In other words, the shelves 202 do not move away from their fixed positions and are fixedly mounted within the storage tower 200 such that the shelves 202 are stationarily in their fixed positions.

While the gaps 218 provide clearance between the bins 206a, 206b, 206c to allow for the forking structure 216 to remove one of the storage carriers 204 from one of the bins 206a, 206b, 206c within the storage area 203 of the storage tower 200, the gaps 218 take up crucial space within the storage area of the storage tower 200 limiting the number of storage carriers 204 that may be stored on the shelves 202 within the storage area 203 of the storage tower 200. In other words, the utilization of the storage area 203 within the storage tower 200 as shown in FIG. 4 is not utilized in an optimized fashion as space is wasted within the storage area 203 by providing the gaps 218 to accommodate the forking structure 216 having to enter the gaps 218 to remove one of the storage carriers 204 from the storage tower 200.

The storage carriers 204 as shown in FIG. 4 do not include an RFID structure whereas the storage carrier 114, as shown in FIGS. 3A and 3B, does include the RFID structure 120. In other words, the storage carriers 204 do not include an electronic identification structure that may be scanned by an RFID scanner for tracking and data collection purposes.

Figure 5A:
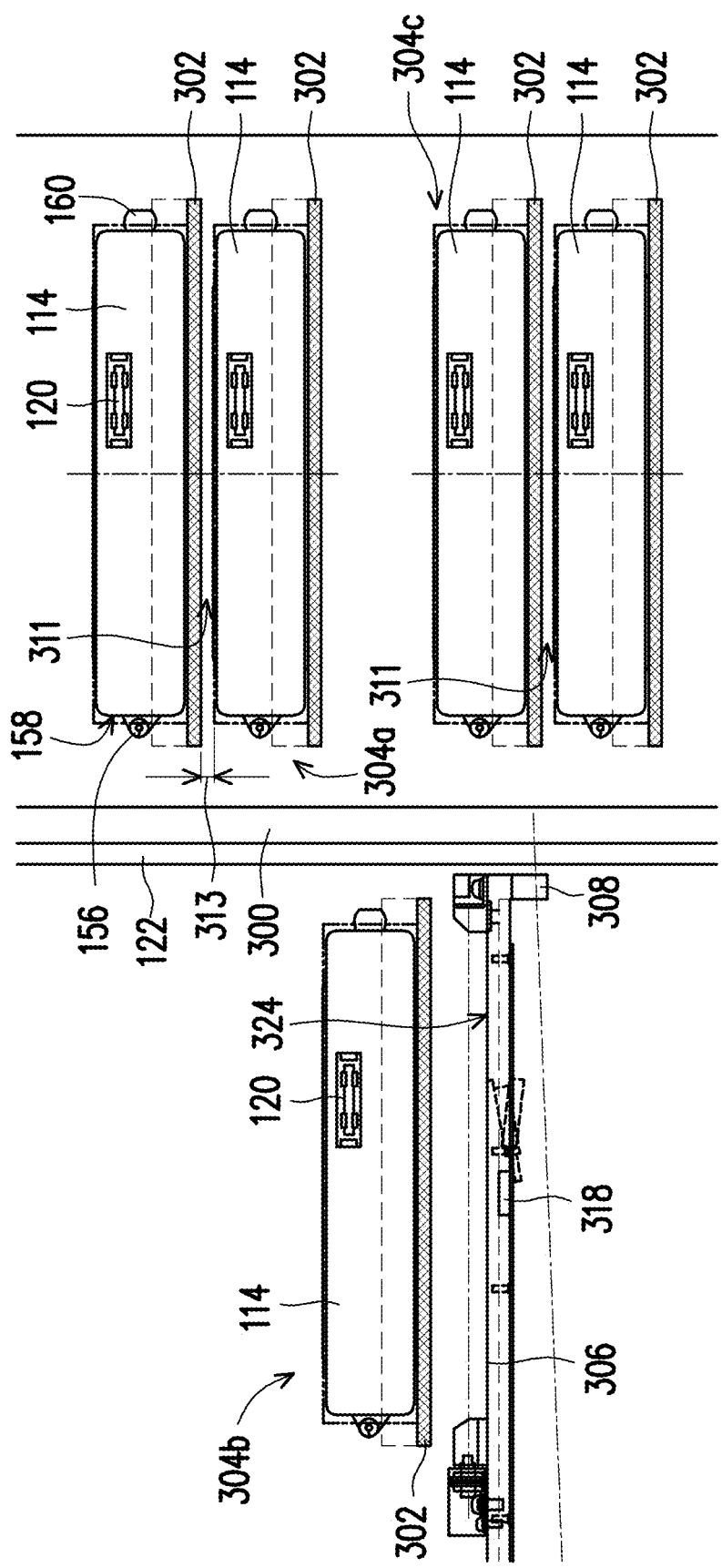
FIG. 5A is a side view of shelves within the storage tower as shown in FIG. 1B with one of the shelves in an opened position, in accordance with some embodiments of the present disclosure.

FIG. 5A is directed to an enhanced view of section A-A of the storage tower 122 as shown in FIG. 1B. The storage tower 122 includes a frame or housing 300 in which the plurality of shelves 302 are present. As shown in FIG. 5A, a corresponding storage carrier 114 is present on a corresponding one of the plurality of shelves 302. The pairs of corresponding shelves 302 and storage carriers 114 may each be referred to as a bin 304a, 304b, 304c. In other words, each bin 304a, 304b, 304c includes a respective storage carrier 114 on a respective shelf 302.

The plurality of bins 304a, 304b, 304c includes a first bin 304a (e.g., upper bin), a second bin 304b (e.g., central bin), and a third bin 304c (e.g., lower bin). The upper bin 304a is above the central and lower bins 304b, 304c. When in a closed position such that the central bin 304b is within the storage tower 122 similar to the positioning the upper and lower bins 304a, 304c as shown in FIG. 5A, the central bin 304b is below the upper bin 304a and is above the lower bin 304c such that the central bin 304b is between the upper bin 304a and the lower bin 304c, and the central bin 304b is adjacent to the upper bin 304a and the lower bin 304c. The lower bin 304c is below the upper bin 304a and the central bin 304b, and the lower bin 304c is adjacent to the central bin 304b when the central bin 304b is in the closed position within the storage tower 122.

As shown in FIG. 5A, the central bin 304b is in an opened position in which the central bin 304b is accessible to a forking structure 306 such that the forking structure 306 may move upward and come into contact with the storage carrier 114 to lift up the storage carrier 114 out of the corresponding shelf 302. Once lifted out from the shelf by the forking structure 306, the forking structure 306 may transport the storage carrier 114 to the storage carrier load port 114 of the stocker 100 as shown in FIG. 1A. While not shown, the forking structure 306 is in mechanical cooperation or includes an actuation structure that may include a motor and a plurality of tracks and rails such that the forking structure 306 may be displaced to different locations within the storage compartment 106 of the stocker 100 to transport the various storage carriers 114 within the stocker 100 to and from various locations within the stocker 100. For example, the forking structure 306 may move the storage carrier back and forth between the corresponding shelf 302 and the storage carrier load port 110.

The forking structure 306 includes a hook structure 308 that is configured to move the corresponding bin 304a, 304b, 304c from the closed position to the opened position. For example, as shown in FIG. 5A, the hook structure 308 of the forking structure 306 was utilized to move (e.g., pull out) the central bin 304b from the closed position to the opened position by mechanically hooking onto or coupling onto a side of the corresponding shelf 302 of the central bin 304b with the hook structure 308, and then moving the forking structure 306 outward and away from the frame 300 to move the central bin 304b from the closed position to the opened position utilizing the hook structure 308.

Figure 5B:
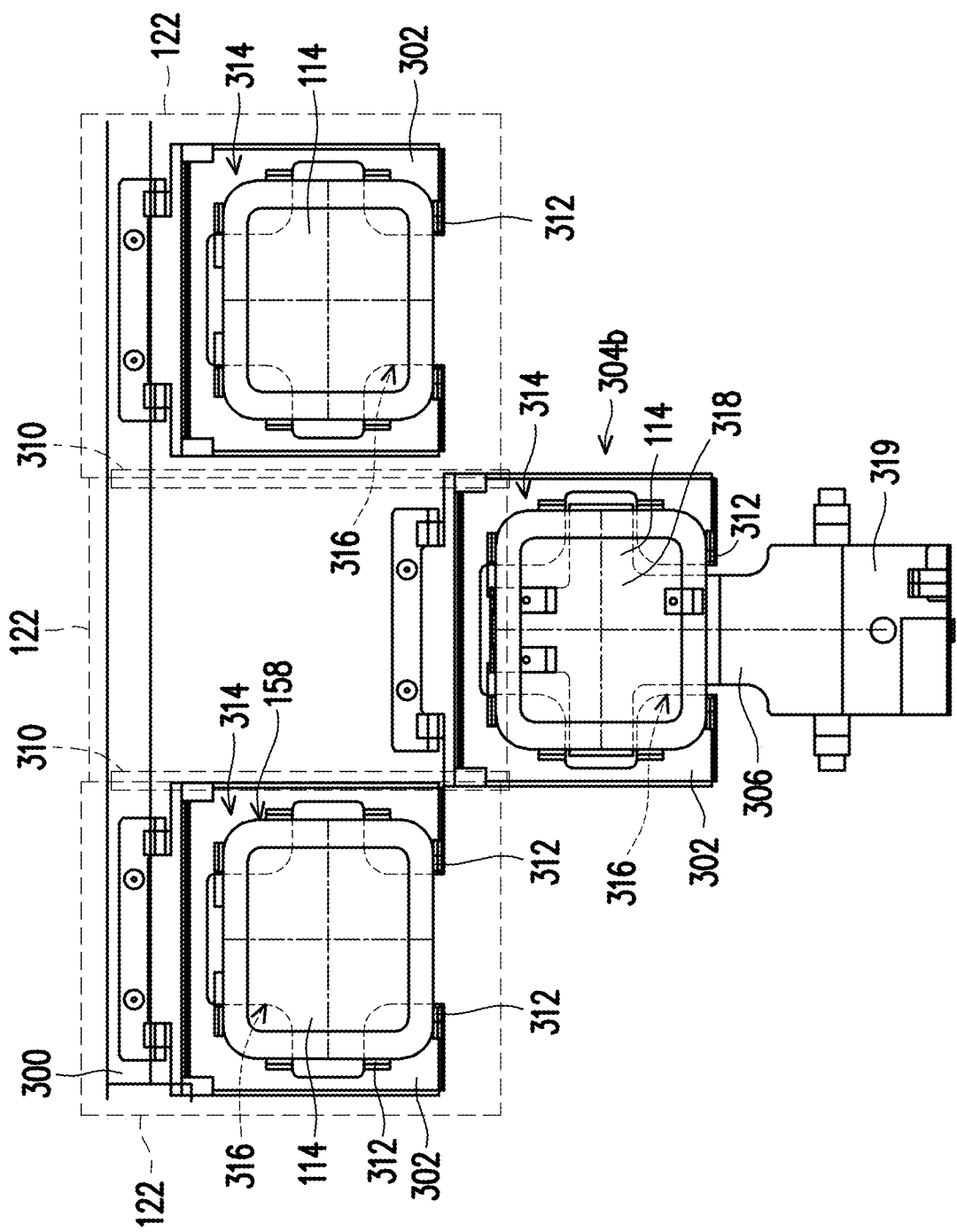
FIG. 5B is a top view of the one shelf within the storage tower in the opened position as shown in FIG. 5A, in accordance with some embodiments of the present disclosure.
Figure 5C:
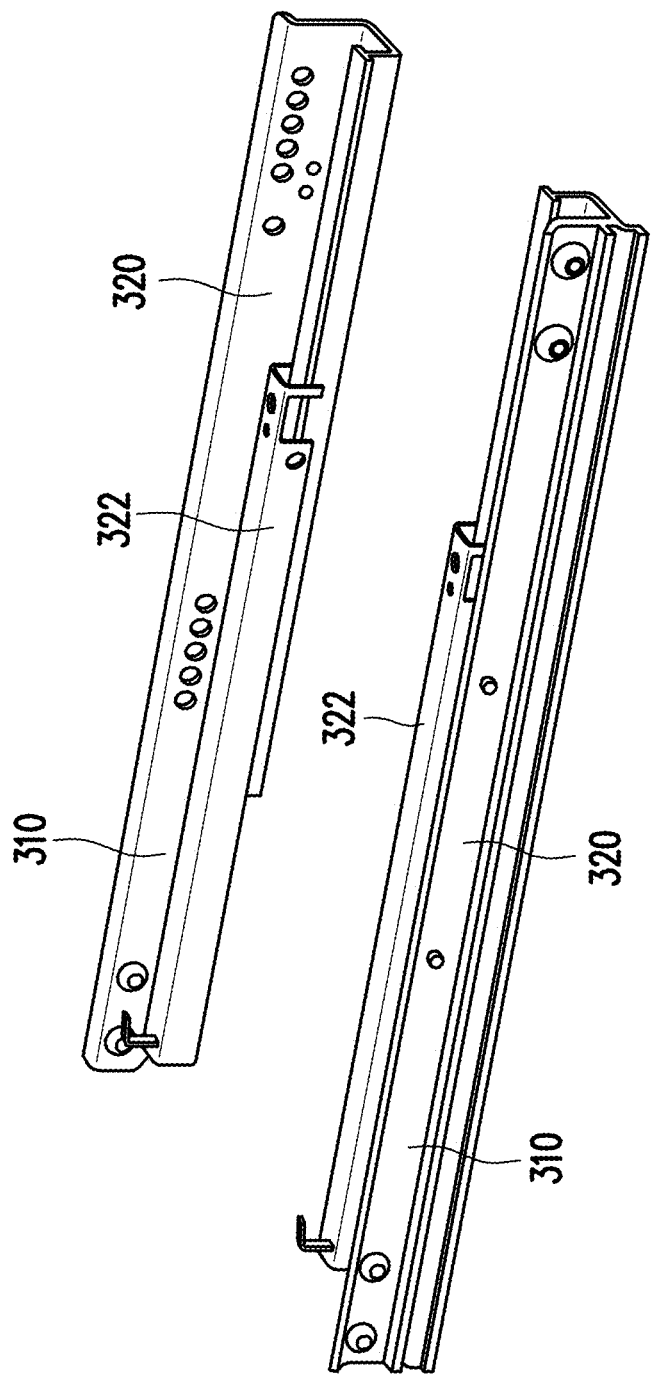
FIG. 5C is a perspective view of slide rails in mechanical cooperation with a respective shelf within the storage tower as shown in FIGS. 5A and 5B, in accordance with some embodiments of the present disclosure.

While not shown in FIG. 5A, the shelves 302 are in mechanical cooperation with slide rails 310 as shown in FIGS. 5B and 5C. The slide rails 310 allow for the shelves of the bins 304a, 304b, 304c to be moved between the opened position and the closed position. The details of the slide rails 310 will be discussed in detail later herein.

A plurality of gaps 311 are between adjacent ones of the bins 304a, 304b, 304c when the bins 304a, 304b, 304c are in respective closed positions of the bins 304a, 304b, 304c. The gaps 311 extend from an upper surface of a respective storage carrier 114 of a lower respective bin to a lower surface of a respective shelf 302 of an upper respective bin that is above the lower respective bin. The gaps 311 each include a dimension 313, which is significantly less than the dimension 214 of the gaps 218 as shown in FIG. 4. For example, the dimension 313 of gaps 311 is such that forking structure 308 cannot fit into gaps 311. The gaps 311 as shown in FIG. 5A being smaller than the gaps 218 as shown in FIG. 4 allows for greater optimization of the use of space within the storage compartment 106 of the stocker 100 as many more of the storage carriers 114 may be stored in the storage compartment 106 in the stocker 100 utilizing the configuration of the storage carriers 114 and the shelves 302 as shown in FIG. 5A relative to the configuration of the storage carriers 204 and the shelves 202 as shown in FIG. 4. For example, less space is necessary to store each storage carrier 114 on each shelf 302 as shown in FIG. 5A relative to the space necessary to store each storage carrier 204 on each shelf 202 as shown in FIG. 4 as the gaps 311 are significantly smaller than the gaps 218. The smaller sized gaps 311 allow for a greater amount of the space within the storage compartment 106 of the stocker 100 to be utilized for storing additional storage carriers 114 instead of being wasted on the larger gaps 218 as shown in FIG. 4.

FIG. 5B is a top plan view of the storage tower 122 as shown in FIGS. 1B and 5A. The storage tower 122 is adjacent to two other storage towers 122 on opposite sides of this central storage tower 122 in which the bin 304b is in the opened position as shown FIG. 5B. In other words, the three storage towers 122 as shown in FIG. 5B are side by side to each other.

Each of the shelves includes a plurality of anti-drop structures 312 that extend outward from surfaces 314 of the shelves 302 that contact the corresponding storage carriers 114 on the shelves 302. The anti-drop structures 312 may be protrusions, extensions, bumpers, or some other similar or like types of structures that abut the respective sides 158 of the storage carriers 114 and act as boundaries to stop the storage carriers 114 from falling off of the shelves 302.

The anti-drop structures 312 abutting the respective sides 158 of the storage carriers 114 position the storage carriers 114 over openings 316 that extend through the shelves 302. As shown in FIG. 5B, the openings 316 are plus (+) shaped. The plus-shaped openings 316 allow for the storage carriers 114 to be removed from the shelves 302 when the shelves 302 are in their opened positions, for example, the shelf 302 of the central bin 304b as shown in FIG. 5B.

The forking structure 306 includes a lift portion 318 at an end of the forking structure 306. The lift portion 318 of the forking structure 306 is plus (+) shaped similar to the openings 316 of the shelves 302. The plus-shape of the lift portion 318, which may be referred to as a plus-shape support portion, is slightly smaller than the plus-shaped openings 316 such that the lift portion 318 may readily pass through the plus-shaped openings 316 and lift up the corresponding storage carrier 114 when the corresponding shelf 302 is in the opened position, for example, such as the central bin 304b as shown in FIG. 5B. In other words, after the lift portion 318 of the forking structure 306 is positioned below the central bin 304b that was previously moved out to the opened position along the slide rails 310 utilizing the hook structure 308 of the forking structure 306, the lift portion 318 is aligned with the corresponding plus-shaped opening 316 and moved upward to contact and lift the corresponding storage carrier 114 out of the corresponding shelf 302 of the central bin 304b. The forking structure 306 may then move or transport the corresponding storage carrier 114 away from the corresponding shelf 302 and the corresponding storage tower 122 to another location within the stocker 100, for example, the storage carrier load port 110.

The forking structure 306 further includes a fastening portion 319 opposite to the lift portion 318. The fastening portion 319 is in mechanical cooperation with an actuation system (e.g., motor, tracks, rails, pulleys, etc.), not shown for simplicity sake, that is configured to move the forking structure 306 to various locations within the stocker 100. For example, the fastening portion 319 may be fastened to the actuation system by a plurality of fasteners (e.g., screws, rivets, nuts and bolts, etc.).

FIG. 5C is a perspective view of the slide rails 310 that include a track portion 320 and a slide portion 322. The track portion 320 is fixedly coupled to the frame 300 of the storage tower 122, for example, by fasteners such as rivets, screws, nuts and bolts, or some other similar or like type of fasteners, and the slide portion 322 is movable coupled to the track portion 320 such that the slide portion 322 may slide along the track portion 320 in a first direction and a second direction opposite to the first direction. The slide portions 322 of the slide rails 310 are fixedly coupled to the shelves 302 such that shelves 302 are fixed relative to the slide portions 322. The shelves 302 move with the slide portions 322 allowing the shelves 302 to be moved from the closed position to the opened position and vice versa by mechanically moving the shelves 302 with the hook structure 308 such that the slide portions 322 slide along the track portions 320. As shown in FIG. 5C, the slide portion 320 is in a retracted position corresponding to the closed positions of the shelves 302 as shown in FIG. 5B at the left-hand side and the right-hand side of FIG. 5B.

In view of the above discussion, when the hook structure 308 of the forking structure 306 is utilized to move the corresponding shelf 302 to the opened position, the slide portion 322 moves along (e.g., slides along) the track portion 320 such that the corresponding shelf 302 moves with the slide portion 322 moving the corresponding shelf 302 from the closed position to the opened position. When the corresponding shelf 302 is in the opened position such as the corresponding shelf 302 of the central bin 304b as shown in FIGS. 5A and 5B, the slide portion 322 is in an expanded position in which the slide portions 322 may extend outward from the frame 300 of the storage tower 122 such that the forking structure 306 may access the storage carrier 114 of the central bin 304b.

Figure 5D:
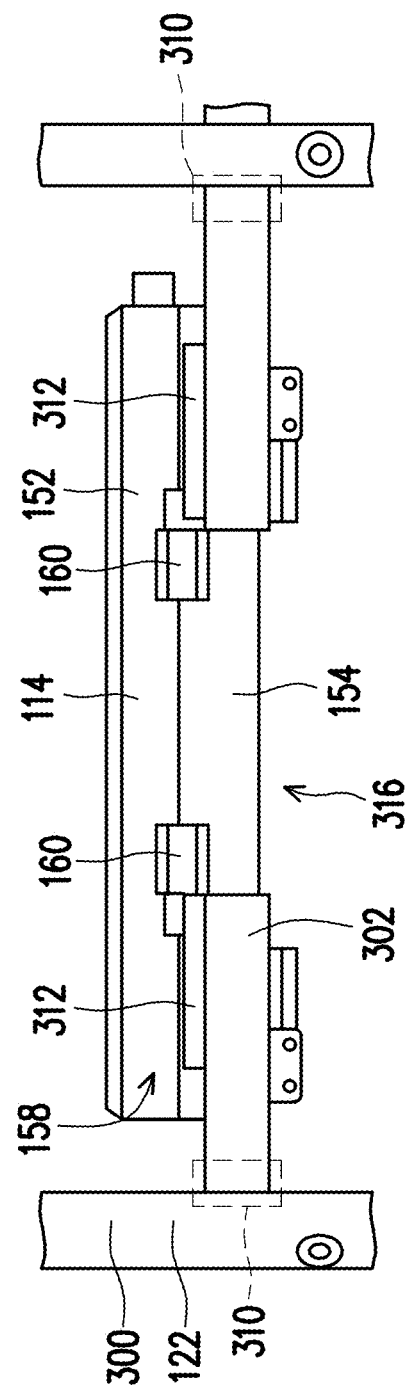
FIG. 5D is a side view of a respective shelf within the storage system as shown in FIGS. 5A and 5B, in accordance with some embodiments of the present disclosure.

FIG. 5D is a side view of the central bin 304b as shown in FIGS. 5A and 5B in mechanical cooperation with the slide rails 310 as shown in FIG. 5C. As discussed above, the track portion 320 of the slide rails 310 are fixedly coupled to the frame 300, and the slide portions 322 of the slide rails 310 are fixedly coupled to the shelves 302. As discussed above, at least some of the anti-drop structures 312 may be more readily seen in FIG. 5D as well.

FIG. 6A is a perspective view of the forking structure 306 with the lift portion 318, which again is plus-shaped. The lift portion 318 includes a surface 324 that contacts the base 154 of the corresponding storage carrier 114 when lifting and removing the corresponding storage carrier 114 from the corresponding shelf 302 when in the opened position.

The lift portion 318 of the forking structure 306 further includes a first end 326, a second end 328, and a third end 330. The second end 328 is opposite to the third end 330. A first anti-drop structure 332 is at the first end 326, a second anti-drop structure 334 is at the second end 328, and a third anti-drop structure 336 is at the third end 330. The first, second, and third anti-drop structures 332, 334, 336 are fastened to the lift portion 318 by fasteners (e.g., screws, nuts and bolts, rivets, etc.). The fastening of the first, second, and third anti-drop structures 332, 334, 336 to the lift portion 318 may allow for the first, second, and third anti-drop structures 332, 334, 336 to be easily and quickly replaced if the first, second, and third anti-drop structures 332, 334, 336 are damaged in use. The second anti-drop structure 334 is opposite to the third anti-drop structure 336.

However, in some alternative embodiments, the first, second, and third anti-drop structures 332, 334, 336 may be integral to the lift portion 318 such that the lift portion 318 and the first, second, and third anti-drop structures 332, 334, 336 may be made of a single continuous material.

As shown in FIG. 6A, the hook structure 308 of the forking structure 306 is integral to the first anti-drop structure 332 such that the first anti-drop structure 332 and the hook structure 308 are made of a single continuous material. However, in some alternative embodiments, the first anti-drop structure 332 and the hook structure 308 at the first end 326 of the lift portion 318 may be separate and distinct components that may be fastened to the forking structure 306 at the first end 326 of the forking structure 306.

A fourth anti-drop structure 338 of the forking structure 306 is at a location between the lift portion 318 and the fastening portion 319 of the forking structure 306. The fourth anti-drop structure 338 is opposite to the first anti-drop structure 332.

The first end 326 may be an end of a first extension 331 of the lift portion 318, the second end 328 may be an end of a second extension 333 of the lift portion 318, and the third end 330 may be an end of a third extension 335 of the lift portion 318.

The first extension 331 is transverse to the second extension 333 and the third extension 335 as shown in FIG. 6A. The first, second, and third extension 331, 333, 335 extend outward from a central portion 337 of the lift-portion 318. A fourth extension 339 extends from the central region 337, and the fourth extension 339 is opposite to the first extension 331. The fastening portion 319 may be coupled to a fourth end of the fourth extension 339, or the fastening portion 319 may be the fourth end of the fourth extension such that the fastening portion 319 and the fourth extension 339 are a single, continuous portion of material.

The first, second, third, and fourth anti-drop structures 332, 334, 336, 338 extend away from the surface 324 of the forking structure 306, and the first, second, third, and fourth anti-drop structures 332, 334, 336, 338 may abut and contact the sides 158 of the corresponding storage carrier 114 as shown in FIGS. 5A and 5B, for example, the storage carrier 114 of the central bin 304b as shown in FIGS. 5A and 5B. In other words, the first, second, third, and fourth anti-drop structures 332, 334, 336, 338 are configured to define boundaries and act as stoppers to stop the corresponding storage carrier 114 from falling off the forking structure 306 when the corresponding storage carrier 114 is being transported within the stocker 100, for example, transporting the corresponding storage carrier 114 to the storage carrier load port 110 to be loaded with one or more workpieces or toolpieces.

A retention structure 340 is on the fastening portion 319 of the forking structure 306. The retention structure 340 may be a clamp and is configured to hold the corresponding storage carrier 114 on the forking structure 306 when transporting the corresponding storage carrier 114 from one location to another location within the stocker 100. As shown in FIG. 6B, the retention structure 340 is moved forward and contacts the first outer surface 164 of the storage carrier 114 to hold the storage carrier 114 on the forking structure to further reduce the likelihood of the storage carrier 114 falling off the forking structure 306 when being transported from a first location to a second location within the stocker 100.

As shown in FIG. 6B, the storage carrier 114 is on the surface 324 of the lift portion 318 of the forking structure 306 and is held in a stationary position relative to the lift portion 318 by the retention structure 340. For example, the second outer surface 168 of the base 154 of the storage carrier 114 physically contacts the surface 324 of the lift portion 318, and the retention structure 340 contacts the first outer surface 164 of the storage carrier 114. As shown in FIG. 6B, the first, second, third, and fourth anti-drop structures 332, 334, 336, 338 wrap around the respective sides 158 of the storage carrier 114 and may physically contact the respective sides 158 of the storage carrier 114 to stationarily position the storage carrier 114 on the lift portion 318 of the forking structure 306.

The retention structure 340 may be brought into contact with the first outer surface 164 of the storage carrier 114 by moving the retention structure 340 towards the first outer surface 164, and, once the retention structure 340 overlaps the first outer surface 164, the retention structure 340 is brought into contact with the first outer surface 164 by moving the retention structure 340 slightly downwards. The retention structure 340 applies enough force to hold the storage carrier 114 on the forking structure 306 in a stationary position relative to the forking structure 306 without damaging the storage carrier 114 or the one or more workpieces or toolpieces within the storage carrier 114. For example, the retention structure 340 may not deform the storage carrier 114 when retaining the storage carrier 114 on the forking structure 306 utilizing the retention structure 340.

Once the retention structure 340 is positioned to hold the storage carrier 114 on the lift portion 318 of the forking structure 306, the forking structure 306 is moved from a first location in the stocker 100 to a second location in the stocker 100. For example, the first location may be the corresponding shelf 302 on which the storage carrier 114 was previously stored on and the second location may be the storage carrier load port 110.

Figure 7:
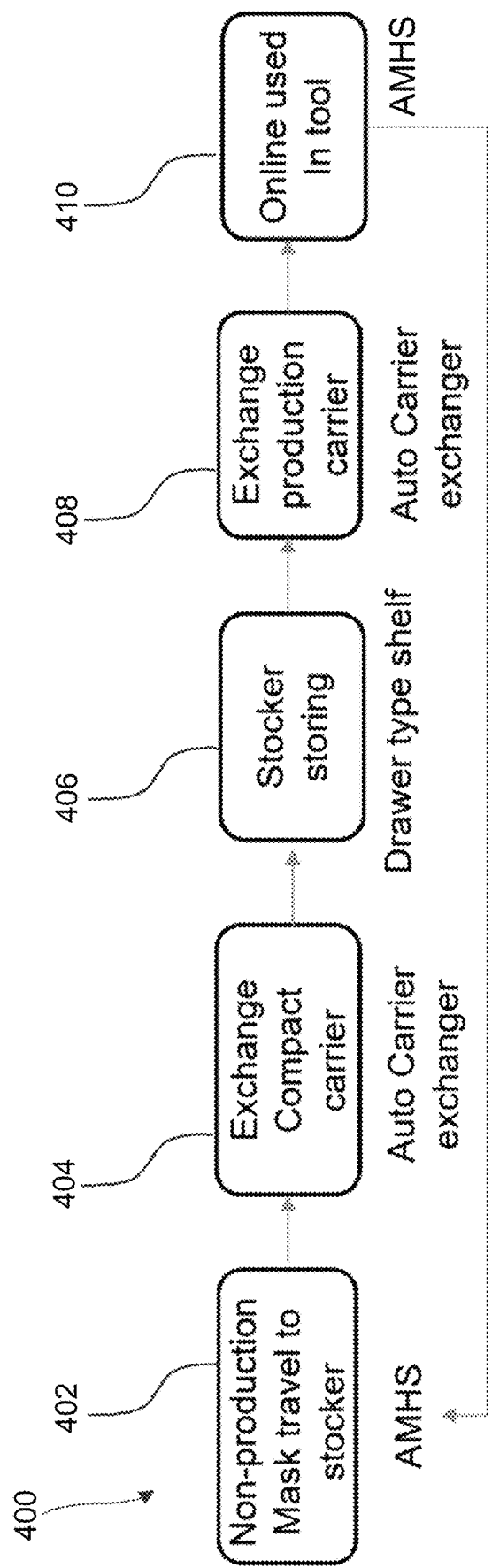
FIG. 7 is a block diagram of a workflow utilizing the stocker as shown in FIG. 1A along with the forking structure as shown in FIGS. 6A and 6B, in accordance with some embodiments of the present disclosure.

FIG. 7 is a block diagram of a method 400 of transporting and loading the storage carriers 114 within the stocker 100 with workpieces or toolpieces, in accordance with embodiments of the method 400 of the present disclosure.

In a first step 402, workpieces (e.g., non-production masks) or tool pieces (EUV reticles) travel from various locations within the external environment 102 outside the stocker 100 to the stocker 100 utilizing the production carrier 112 and the production carrier transport system 118. For example, the production carrier 112, which contains workpieces, toolpieces or both, is picked up by the end effector 118b and is lifted up to the transport rail 118a by retracting the lift structure 118c to which the end effector 118b is mechanically coupled. The production carrier transport system 118 then transports (e.g., moves) the production carrier 112 along the transport rail 118a to the stocker 100 and aligns the end effector 118b holding the production carrier 112 with the production carrier load port 108 of the stocker 100.

Once the end effector 118b and the production carrier 112 are aligned with the production carrier load port 108, the end effector 118b and the production carrier 112 are lowered down to the production carrier load port 108 by extending the lifting structure 118c such that the production carrier 112 is at or on the production carrier load port 108. Once the production carrier 112 is at or on the production carrier load port 108 of the stocker 100, the production carrier 112 may be released by the end effector 118b of the production carrier transport system 118.

After the first step 402, in a second step 404 the one or more workpieces or toolpieces within the production carrier 112 are transferred from the production carrier 112 to the storage carrier 114 within the stocker 100. The one or more workpieces, toolpieces, or both within the production carrier 112 are transferred into the storage carrier 114 by the carrier exchanger 116.

However, before the one or more workpieces, toolpieces, or both may be transferred from the production carrier 112 to the storage carrier 114, the storage carrier 114 is transported to the storage carrier load port 110 of the stocker 100. For example, the forking structure 306 is moved to one of the shelves 302 of one of the storage towers 122 within the stocker 100. Once the forking structure 306 is at and aligned with the shelf 302 of interest, the forking structure 306 is moved forward towards the shelf 302 and then the hook structure 308 at the first end 326 of the forking structure 306 is brought into mechanical cooperation with the shelf 302. The forking structure 306 is then moved outward and away from the frame 300 of the storage tower 122 while the hook structure 308 is in mechanical cooperation with the shelf 302. This outward movement of the forking structure 306 moves the shelf 302 from the closed position to the opened position such that the storage carrier 114, which is on the shelf 302 of interest, is accessible by the lift portion 318 of the forking structure 306. As may be readily appreciated, the shelves 302 are pulled out to the opened position from the closed position in a similar fashion as a drawer being pulled out utilizing a handle of the drawer.

Once the shelf 302 is in the opened position such that the storage carrier 114 on the shelf 302 is accessible to the lift portion 318 of the forking structure 306, the hook structure 308 is removed from mechanical cooperation with the shelf 302 and the lift portion 318 is moved below the shelf 302 and the storage carrier 114. The lift portion 318 is also aligned with the shelf 302 and the storage carrier 114. The plus-shaped lift portion 318 of the forking structure 306 is moved upward and through the plus-shaped opening 316 of the shelf 302 and the surface 324 of the plus-shaped lift portion 318 is brought into contact with the second outer surface 168 of the base 154 of the storage carrier 114. The lift portion 318 of the forking structure 306 continues to move upward after the surface 324 is brought into contact with the base 154 of the storage carrier 114 lifting the storage carrier 114 off the surface 314 of the shelf 302. Once there is enough clearance such that the storage carrier 114 will not bump into the anti-drop structures 312 of the shelf 302, the lift portion 318 of the forking structure 306 is moved away from the shelf 302 and the storage tower 122 in a lateral direction such that the storage carrier 114 is removed from the shelf 302. The forking structure 306 then moves or transports the storage carrier 114 to the storage carrier load port 110 of the stocker 100. The forking structure 306 then positions the storage carrier 114 at or on the storage carrier load port 110, and the forking structure 306 releases the storage carrier 114 once the storage carrier 114 is at or on the storage carrier load port 110.

While transporting the storage carrier 114 to the storage carrier load port 110 by the forking structure 306, the retention structure 340 is actuated to contact the first outer surface 164 of the storage carrier 114 to reduce the likelihood of the storage carrier 114 falling off the lift portion 318 of the forking structure 306 while being transported to the storage carrier load port 110. For example, the retention structure 340 may clamp down onto the storage carrier 114 when the lift portion 318 comes into contact with the storage carrier 114, or, alternatively, the retention structure 340 may clamp down onto the storage carrier 114 when there is enough clearance between the storage carrier 114 and the shelf 302 on which the storage carrier 114 was previously present.

Once the storage carrier 114 is at the storage carrier load port 110 and the production carrier 112, which still contains the one or more workpieces, toolpieces, or both, is at the production carrier load port 108, the storage carrier 114 and the production carrier 112 are opened to access the respective internal compartments 140, 166 of the production carrier 112 and the storage carrier 114, respectively. Once both are opened, the one or more workpieces, toolpieces, or both may be transferred from the internal compartment 140 of the production carrier 112 to the internal compartment 166 of the storage carrier 114 by the carrier exchanger 116.

In some embodiments, the production carrier 112 may be opened by an automated opening and closure structure (not shown) at the production carrier load port 108 that automatically opens the production carrier 112 by opening the lid 126 once the production carrier 112 is present at or on the production carrier load port 108. For example, the lid 126 may be moved to an opened position by an automated opening and closure structure or may be removed by the automated opening and closure structure from the base 127 of the production carrier 112. Once the production carrier 112 is opened, the carrier exchanger 116 may readily access the internal compartment 140 of the production carrier 112.

In some embodiments, the end effector 116b of the carrier exchanger 116 may open the lid 126 of the production carrier by moving the lid 126 to the opened position or by removing the lid 126 from the base 127 of the production carrier 112. For example, the end effector 116b may grip onto the handle 128 and move upward to access the internal compartment 140 within the production carrier and gain access to the one or more workpieces, toolpieces, or both within the production carrier 112. Once the production carrier 112 is opened, the carrier exchanger 116 may readily access the internal compartment 140 of the production carrier 112.

In some embodiments, the storage carrier 114 may be opened by an automated opening and closure structure (not shown) at the storage carrier load port 110 that automatically opens the storage carrier 114 by opening the lid 152 once the storage carrier 114 is present at or on the storage carrier load port 110. For example, the closure structures 160 may be unlocked and the lid 152 may then be moved or rotated to an opened position about the hinges 156 by the automated opening and closure structure to access the internal compartment 166 within the storage carrier 114. Once the lid 152 is in the opened position, the internal compartment 166 within the storage compartment 106 is readily accessible to the carrier exchanger 116.

In some embodiments, the end effector 116b of the carrier exchanger 116 may open the lid 152 by first unlocking the closure structures 160 and then gripping the lid 152 and rotating the lid 152 about the hinges 156 to the opened position. Once the lid 152 is in the opened position, the internal compartment 166 within the storage compartment 106 is readily accessible to the carrier exchanger 116.

Once the production carrier 112 and the storage carrier 114 are at the production carrier load port 108 and the storage carrier load port 110, respectively, and are both opened such that the respective internal compartments 140, 166 are readily accessible to the carrier exchanger 116, the end effector 116b is moved by the robotic arm 116a of the carrier exchanger 116 to transfer the one or more workpieces, toolpieces, or both within the internal compartment 140 of the production carrier 112 to the internal compartment 166 of the storage carrier 114. For example, the end effector 116b may pick up and remove the one or more workpieces, toolpieces, or both one at a time out of the internal compartment 140 of the production carrier 112 and position the one or workpieces, toolpieces, or both one at a time within the internal compartment 166 of the storage carrier 114. Once the one or more workpieces, toolpieces, or both are transferred from the production carrier 112 to the storage carrier 114 by the carrier exchanger 116, the storage carrier 114 is closed enclosing the one or more workpieces, toolpieces, or both within the internal compartment 166 of the storage carrier 114 for storage within the stocker 100.

In some embodiments, the storage carrier 114 may be closed by the automated opening and closure system by rotating the lid 152 to the closed position and interlocking the closure structures 160 such that the one or more workpieces, toolpieces, or both are enclosed within the internal compartment 166 of the storage carrier 114. In some embodiments, the storage carrier 114 may be closed by the end effector 116b of the carrier exchanger 116 by moving the lid 152 of the storage carrier 114 from the opened position to the closed position and interlocking the closure structures 160 enclosing the one or more workpieces, toolpieces, or both within the internal compartment 166 of the storage carrier 114.

After the second step 404 in which the one or more workpieces, toolpieces, or both are transferred from the production carrier 112 to the storage carrier 114, in a third step 406 the lift portion 318 of the forking structure 306 removes the storage carrier 114, which is closed and contains the one or more workpieces, toolpieces, or both, and transports the storage carrier 114 to the shelf 302 in the opened position. The plus-shaped lift portion 318 is then aligned with and passed through the plus-shaped opening 316 of the shelf 302 in a downward direction such that the second outer surface 168 of the base 154 of the storage carrier 114 comes into contact with the surface 314 of the shelf 302. Once the storage carrier 114 is on the shelf 302 and is removed from the lift portion 318 of the forking structure 306, the hook structure 308 is brought into mechanical cooperation with the shelf 302 and the shelf 302 is moved from the opened position to the closed position by moving the forking structure 306 laterally towards the frame 300 of the storage tower 122. This lateral movement of the forking structure 306 towards the frame 300 of the storage tower 122 retracts the slide portions 322 of the slide rails 310 along the track portions 320 of the slide rails 310 moving the shelf 302 from the opened position to the closed position to store the storage carrier 114 on the shelf 302 within the stocker 100.

In an alternative embodiment, the slide rails 310 may be in mechanical cooperation with an automated closure structure that moves the shelf 302 from the opened position to the closed position. For example, automated closure structure may be a soft-closure damping apparatus that moves the shelf 302 from the opened position to the close position when the hook 308 gently pushes on the shelf 302, or the automated closure structure may be a sensor and a motor that moves the slide rails 310 from the opened position to the closed position when the sensor detects the storage carrier 114 present on the shelf 302.

At some later time after storing the storage carrier 114 containing the one or more workpieces, toolpieces, or both within the stocker 100, in a fourth step 408 the forking structure 306 may transport the storage carrier 114, which contains the one or more workpieces, toolpieces, or both, back to the storage carrier load port 110 within the stocker 100, and the production carrier 112 may be transported back to the production carrier load port 108. Then the storage carrier 114 and the production carrier 112 may be opened and the carrier exchanger 116 may then transfer the one or more workpieces, toolpieces, or both from the storage carrier 114 to the production carrier 112. Once the one or more workpieces, toolpieces, or both are transferred from the storage carrier 114 to the production carrier 112, the storage carrier 114 and the production carrier 112 are closed. The storage carrier 114 is then transported back to the shelf 302 by the lift portion 318 of the forking structure 306, and the production carrier 112 is moved away from the stocker 100 by the production carrier transport system 118. In other words, this is the reverse process carried out in the first step 402, the second step 404, and the third step 406.

In a fifth step 410, the production carrier transport system 118 transports the production carrier 112, which was filled with the one or more workpieces, toolpieces, or both in the fourth step 408, to another location in the external environment 102 outside the stocker 100. For example, this location may be another tool apparatus within the external environment 102 (e.g., semiconductor factory, foundry, FAB, etc.) to further process or utilize the one or more workpieces, toolpieces, or both.

In view of the above discussion of the method 400, the respective steps 402, 404, 406, 408, 410 may be carried out in any order to transport and store the one or more workpieces, toolpieces, or both within the storage carriers 114, or transport the one or more workpieces, toolpieces, or both to some other location spaced from the stocker 100 within the external environment 102 utilizing the production carrier transport system 118.

Figure 8A:
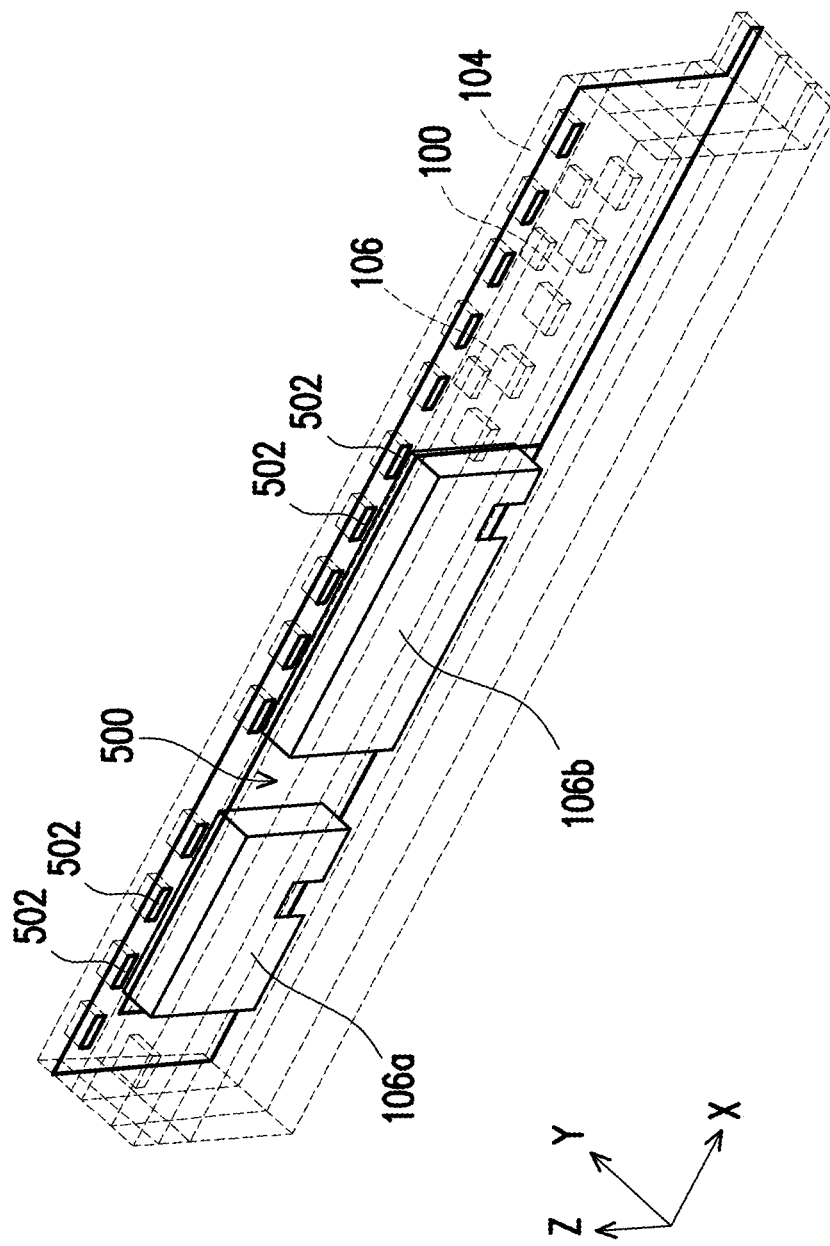
FIG. 8A is a schematic perspective view of a storage system including an air flow circulation system, in accordance with some embodiments of the present disclosure.

FIG. 8A is a perspective view of the stocker 100 with the storage compartment 106 that may contain several of the storage towers 122 as shown in FIG. 1B as well as the structures as shown in FIGS. 5A-5D, 6A, and 6B. As shown in FIG. 8A, the storage compartment 106 includes a first storage area 106a and a second storage area 106b that are spaced from each other by an air shaft 500, which is between the first storage area 106a and the second storage area 106b.

A plurality of filter fan units (FFUs) 502 are in fluid communication with the first storage area 106a and the second storage area 106b. The FFUs 502 are configured to circulate air through the first and second storage areas 106a, 106b and filter the air before the air enters the first and second storage areas 106a, 106b. This filtering of the air before entering the first and second storage areas 106a, 106b reduces the exposure of the storage carriers 114, which are stored within the first and second storage areas 106a, 106b to contaminants and debris. The FFUs may also control and maintain humidity within the first and second storage areas 106a, 106b to reduce the exposure of the storage carriers 114 to humidity that may result in condensation within the first and second storage areas 106a, 106b. The FFUs may also be utilized to assist in controlling the humidity and removing the contaminants from the air within the storage compartment 106 of the stocker 100 as a whole.

Figure 8B:
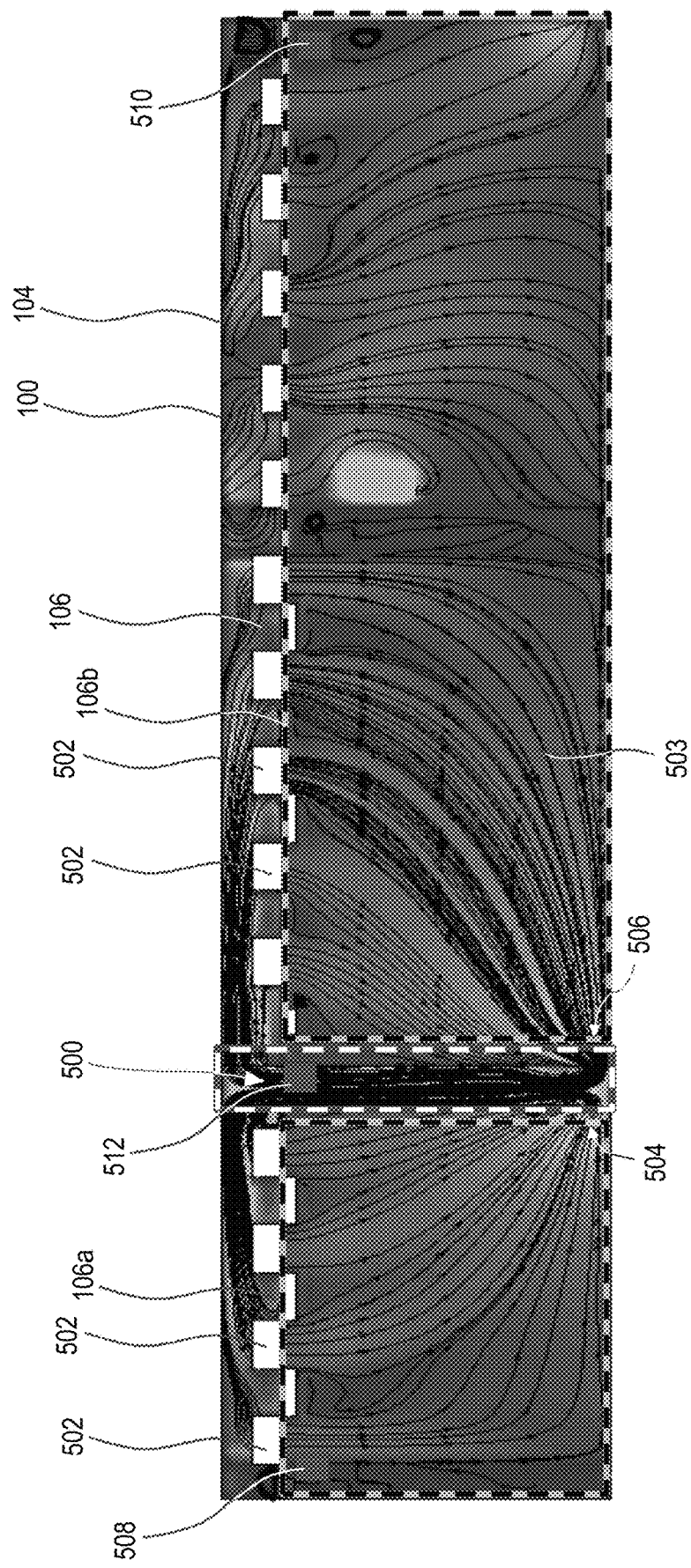
FIG. 8B is schematic side view of a storage system including air flow circulation system, in accordance with some embodiments of the present disclosure.

As shown in FIG. 8B, a plurality of arrows 503 are representative of air flow through the first storage area 106a, the second storage area 106b, and the air shaft 500. The air flows in a counterclockwise direction through the first storage area 106a based on the orientation of the stocker 100 as shown in FIG. 8B. For example, the air flows through the FFUs 502 at an upper end of the first storage area 106a before entering the first storage area 106a to remove and filter contaminants in the air as well as control humidity of the air entering the first storage area 106a. The humidity of the air entering the first storage area 106a may be controlled by removing water vapor from the air utilizing the FFUs 502. The air flows downward through the first storage area 106a to a lower right hand corner of the first storage area 106a at which a first air outlet 504 is present. The air then exits the first storage area 106a through the first air outlet 504 into the air shaft 500.

The air flows in a clockwise direction through the second storage area 106b based on the orientation of the stocker 100 as shown in FIG. 8B. For example, the air flows through the FFUs 502 at an upper end of the second storage area 106b before entering the second storage area 106b to remove and filter contaminants in the air as well as control humidity of the air entering the second storage area 106b. The humidity of the air entering the second storage area 106b may be controlled by removing water vapor from the air utilizing the FFUs 502. The air flows downward and through the second storage area 106b to a lower left hand corner of the second storage area 106b at which a second air outlet 506 is present. The air then exits the second storage area 106b through the second air outlet 506 into the air shaft 500.

Once the air enters the air shaft 500 through the first and second air outlets 504, 506, the air flows upward away from lower ends of the first and second storage areas 106a, 106b, respectively, to the upper ends of the first and second storage areas 106a, 106b, respectively. The air is then recirculated through the FFUs 502 at the upper ends of the first and second storage areas 106a, 106b, respectively, and back into the first and second storage areas 106a, 106b.

In view of the above discussion, the air being circulated and recirculated through the first and second storage areas 106a, 106b improves a quality of air being passed through the first and second storage areas 106a, 106b. In other words, this reduces the likelihood of contaminants entering the first and second storage areas 106a, 106b reducing the likelihood of damaging the workpieces, toolpieces, or both stored within the storage carriers 114 in the first and second storage areas 106a, 106b. Similarly, the FFUs 502 may be utilized to control the humidity of the air passing through the first and second storage areas 106a, 106b to reduce the likelihood of damaging the workpieces, toolpieces, or both being stored within the storage carriers 114 in the first and second storage areas 106a, 106b, respectively.

The storage compartment 106 of the stocker 100 is enclosed from the external environment 102 such that air external to the stocker 100 may not readily enter the stocker 100 improving efficiency of the FFUs 502 in maintaining the quality of air (e.g., controlling contaminants and humidity as well as similar or like types of qualities of the air) within the stocker as a whole as well as the first and second storage areas 106a, 106b in which the storage carriers 114 are located and stored.

The first and second storage areas 106a, 106b may contain one or more of the storage towers 122 as shown in FIG. 1B and as discussed herein. The first and second storage areas 106a, 106b may include all or some of the structures and features as discussed and shown in FIGS. 1B, 5A-5D, 6A, and 6B, respectively. These structures and features as shown in FIGS. 1B, 5A-5D, 6A, and 6B may be utilized to transport, transfer, or store one or more workpieces, toolpieces, or both that may be utilized in the manufacturing of semiconductor devices within the external environment 102, which may be a semiconductor factory, foundry, FAB, or some other similar or like type of location in which semiconductor or electronic devices are manufactured.

As shown in FIG. 8B, a first sensor 508 is in the first storage area 106a, a second sensor 510 in the second storage area 106b, and a third sensor 512 is in the air shaft 500. The first, second, and third sensors 508, 510, 512 may be temperature/humidity sensors that monitor qualities of air within the first storage area 106a, the second storage area 106b, and the air shaft 500, respectively. In some embodiments, the first, second, and third sensors 508, 510, 512 may detect levels of contaminants or debris within the first storage area 106a, the second storage area 106b, and the air shaft 500, respectively, as well. In other words, the first, second, and third sensors 508, 510, 512 may be air quality sensors that detect and sense various qualities of the air flowing through the first storage area 106a, the second storage area 106b, and the air shaft 500, respectively.

For example, the first sensor 508 may monitor a temperature, a humidity, a level of contaminants, or some other type of quality of air being circulated through the first storage area 106a. For example, the second sensor 510 may monitor a temperature, a humidity, a level of contaminants, or some other type of quality of air being circulated through the second storage area 106b. For example, the third sensor may monitor a temperature, a humidity, a level of contaminants, or some other type of quality of air being circulated through the air shaft 500.

As shown in FIG. 8B, the first sensor 508 is at an upper left hand corner of the first storage area 106a, the second sensor 510 is at the upper right hand corner of the second storage area 106b, and the third sensor 512 is closer to an upper end of the air shaft 500 than a lower end of the air shaft 500. The third sensor 512 is adjacent to the upper ends and is between the upper ends of the first and second storage areas 106a, 106b, respectively.

In view of the above discussion within the present disclosure, the configuration of the shelves 302 and the storage carriers 114 as shown in FIGS. 5A-5D optimizes the utilization of the space within the storage compartment 106 relative to the configuration of the shelves 202 and the storage carriers 204 as shown in FIG. 4. To summarize, the number of storage carriers 114 stored within the stocker 100 utilizing the configuration of the shelves 302 can be increased relative to the configuration of the shelves 202 as shown in FIG. 4 as the gaps 311 as shown in FIG. 5A are smaller than the gaps 218 as shown in FIG. 5A. The gaps 311 being smaller than the gaps 218 allow for the number of shelves 302 to be increased relative to the shelves 202 allowing for a greater number of storage carriers 114 to be stored utilizing the shelves in the stocker 100 relative to utilizing the shelves 202 to store the storage carriers 114 within the stocker 100. In other words, the size and shape of the stocker 100 may remain the same when utilizing the configuration as shown in FIG. 5A but a greater number of storage carriers 114 may be stored in the stocker 100 relative to the configuration as shown in FIG. 4 since the space saved with the smaller gaps 311 may be utilized to store additional storage carriers 114. This allows for a great number of workpieces, toolpieces, or both to be stored in the stocker 100 improving efficiency of the semiconductor factory (FAB) as a greater number of workpieces, toolpieces, or both may be stored in the stocker 100 without increasing the size of the stocker 100. This may allow for fewer stockers 100 within the semiconductor factory (FAB) allowing for a greater number of tool apparatuses to be located within the semiconductor factory (FAB) resulting in an increase in a manufacturing speed of semiconductor devices through the semiconductor factory (FAB).

The utilization of the storage space within the storage compartment 106 of the stocker 100 is also further optimized when utilizing the configuration as shown in FIG. 5A instead of the configuration as shown in FIG. 4. For example, the shelves 302 are coupled to slide portions 322 of the slide rails 310 allowing for telescopic movement of the slide rails 310 and providing the shelves 302 with a degree of freedom to move inward and outward of the storage tower 122 along with the slide portions 322. This provides simple access to the storage carriers 114 on the shelves 302 and allows for the gaps 311 as shown in FIG. 5A to be significantly smaller than the gaps 218. Furthermore, as the shelves 202 as shown in FIG. 4 are fixedly mounted and may not move from their fixed and mounted positions, the larger gaps 218 are larger than the smaller gaps 311 as the gaps 218 are large enough to allow for the forking structure 216 to be inserted between adjacent ones of the bins 206a, 206b, 206c to remove storage carriers 114 from the storage tower 200. In other words, the shelves 302 being able to move outward and inward through the shelves mechanical coupling to the slide portions 322 of the slide rails 310 allows for the gaps 311 as shown in FIG. 5A to be significantly smaller than the larger gaps 218 as shown in FIG. 4 as no extra clearance space is necessary for the forking structure 216 to fit within the gaps 311 as shown in FIG. 5A.

In view of the above discussion within the present disclosure, the storage carriers 114 include the RFID structures 120 that allow for the contents of the storage carriers 114 to be tracked by a computer (e.g., memory, processor, etc.) whereas the storage carriers 204 do not include any electronic tracking structure, and, accordingly, the contents of the storage carriers 204 are difficult to track. The tracking of the storage carriers 114 with the RFID structures 120 relative to the storage carriers 204 without any electronic tracking results in greater efficiency of data and control of the semiconductor factory (FAB) when utilizing the storage carriers 114 with the RFID structures 120 instead of utilizing the storage carriers 204 that do not include electronic tracking structures.

In view of the above discussion within the present disclosure, the storage compartment 106 of the stocker 100 being closed off from the external environment by the housing 104 of the stocker 100 improves the air quality within the stocker 100 as maintaining the air quality within the first storage area 106a and the second storage area 106b of the storage compartment 106 is easier. For example, the first, second, and third sensors 508, 510, 512 are utilized to monitor the air quality within the first storage area 106a, the second storage area 106b, and the air shaft 500, and this monitoring allows for optimization of the air quality within the first storage area 106a, the second storage area 106b, and the air shaft 500 as the control of the FFUs 502 may be optimized to improve the air quality within the first storage area 106a, the second storage area 106b, and the air shaft 500 to reduce the likelihood of damaging any workpieces, toolpieces, or both stored within the first and second storage areas 106a, 106b of the stocker. The first, second, and third sensors 508, 510, 512 may be in electrical communication with the FFUs 502 either directly or indirectly through a computer or processor coupled to both the FFUs 502 and the first, second, and third sensors 508, 510, 512. The utilization of the FFUs 502 and the first, second, and third sensors 508, 510, 512 reduces the likelihood of damaging workpieces, toolpieces, or both within storage carriers 114 stored within the stocker 100 by removing contaminants from the air and reducing the likelihood of contaminants being exposed to these workpieces, toolpieces, or both. The utilization of the FFUs 502 and the first, second, and third sensors 508, 510, 512 reduces the likelihood of damaging the workpieces, toolpieces, or both within the storage carriers 114 stored within the stocker 100 by controlling humidity within the first and second storage areas 106a, 106b reducing the likelihood of water vapor being exposed to these workpieces, toolpieces, or both within the stocker 100.

In at least one embodiment of the present disclosure, a manufacturing system may be summarized as comprising a stocker including: a housing; a storage compartment within the housing and delimited by the housing; a plurality of shelves within the storage compartment; a plurality of storage carriers on the plurality of shelves, each storage carrier on a corresponding one of the plurality of shelves, and each storage carrier including: a first surface that contacts the corresponding one of the plurality of shelves; a second surface opposite from the first surface and facing away from the corresponding one of the plurality of shelves; and a first dimension extends from the first surface to the second surface; and a plurality of gaps each having a second dimension extending from a corresponding one of the second surfaces of one of the plurality storage carriers to an adjacent one of the plurality of shelves, the second dimension being less than the first dimension.

In at least one embodiment of the present disclosure, a forking robot may be summarized as comprising: a plus-shape support structure including: a first extension having a first end; a second extension having a second end, the second extension is transverse to the first extension; a third extension having a third end, the third extension is transverse to the first extension, the third end being opposite to the first end; and a fourth extension having a fourth end, the fourth extension is transverse to the second and third extensions; a first boundary wall structure at the first end; a second boundary wall structure at the second end; a third boundary wall structure at the third end; a fourth boundary wall structure on the fourth extension; and a hook at the first end, the hook is opposite to the first boundary wall structure.

In at least one embodiment of the present disclosure, a method may be summarized as comprising: pulling a shelf within a stocker from a closed position to an opened position utilizing a hook of a forking robot within the stocker;

removing a storage carrier from the shelf utilizing the forking robot to remove the storage carrier from the shelf and support the storage carrier; transporting the storage carrier to a storage carrier load port within the stocker; removing a workpiece within a first storage compartment of a production carrier at a production carrier load port with a carrier exchanger; inserting the workpiece into a second storage compartment of the storage carrier at the storage carrier load port; transporting the storage carrier containing the workpiece from the storage carrier load port to the shelf; placing the storage carrier containing the workpiece onto the shelf; and moving the shelf from the opened position to the closed position to store the storage carrier containing the workpiece within the stocker.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing system, comprising:
   a stocker including:
      a housing;
      a storage compartment within the housing and delimited by the housing;
      a plurality of shelves within the storage compartment;
      a plurality of storage carriers on the plurality of shelves, each storage carrier on a corresponding one of the plurality of shelves, and each storage carrier including:
         a first surface that contacts the corresponding one of the plurality of shelves;
         a second surface opposite from the first surface and facing away from the corresponding one of the plurality of shelves; and
         a first dimension extends from the first surface to the second surface; and
      a plurality of gaps each having a second dimension extending from a corresponding one of the second surfaces of one of the plurality storage carriers to an adjacent one of the plurality of shelves, the second dimension being less than the first dimension;
   a forking robot including:
      a plus-shape support structure including a plurality of ends, the plus-shape support structure configured to, in operation, support a corresponding one of the plurality of storage carriers when present on the plus-shape support structure;
      a plurality of boundary walls at the plurality of ends configured to, in operation, maintain a position of the corresponding one of the plurality of storage carriers when on the plus-shape support structure; and
      a hook at a first end of the plurality of ends, the hook configured to, in operation, engage a corresponding one of the plurality of shelves.

2. The manufacturing system of claim 1, further comprising a production carrier transport system in mechanical cooperation with the stocker, the production carrier transport system includes an end effector configured to mechanically cooperate with production carriers.

3. The manufacturing system of claim 1, wherein:
   the stocker further includes:
      a production carrier load port that is accessible by a production carrier transport system, the production carrier load port is configured to receive production carriers;
      a storage carrier load port that is accessible, the storage carrier load port is configured to receive the storage carriers; and
      a carrier exchanger within the housing, the carrier exchanger is between the production carrier load port and the storage carrier load port, the carrier exchanger is configured to exchange workpieces to and from the production carriers and the storage carriers through the production carrier load port and the storage carrier load port, the carrier exchanger includes an end effector at an end of the carrier exchanger; and
   the forking robot is within the storage compartment of the housing of the stocker, and the forking robot is configured to, in operation, transport the plurality of storage carriers to and from the storage carrier load port.

4. The device of claim 1, wherein the hook is configured to, in operation, engage with the corresponding one of the plurality of shelves to move the corresponding one of the plurality of shelves from closed position to an opened position.

5. The manufacturing system of claim 1, wherein the forking robot further includes:
   a clamp configured to, in operation, clamp down on the corresponding one of the plurality of storage carriers when present on a plus-shape support structure.

6. The manufacturing system of claim 1, wherein each one of the plurality of shelves includes one or more slide rails and each one of the plurality of shelves is movable between a first position and a second position.

7. The manufacturing system of claim 6, wherein the first position is a retracted position to store a corresponding one of the plurality of storage carriers within the stocker and the second position is an extended position to access the corresponding one of the plurality of storage carriers.

8. The manufacturing system of claim 1, wherein the plurality of storage carriers each include a radio-frequency identification (RFID) structure configured to, in operation, identify each one of the plurality of storage carriers.

9. The manufacturing system of claim 1, wherein the storage compartment includes:
   a first storage area in which air flows from a first end of the first storage area to a second end of the first storage area in a first direction, the second end is opposite to the first end;
   a second storage area in which air flows from a third end of the second storage area to a fourth end of the second storage area in the first direction, the third end is opposite to the fourth end;
   an air shaft area between the first storage area and the second storage area in which air flows from a fifth end of the air shaft area to a sixth end of the air shaft area in a second direction, the sixth end is opposite to the fifth end, and the second direction is opposite to the first direction, the fifth end is adjacent to the second and third ends, and the sixth end is adjacent to the second and fourth ends; and a plurality of fan filter units at the first end and the third end.

10. The manufacturing system of claim 9, wherein a first sensor is between the first and third ends, and the first sensor is within the air shaft area.

11. The manufacturing system of claim 10, wherein a second sensor is at a corner of the third end, and the corner of the third end is spaced from the air shaft.

12. A forking robot, comprising:
a plus-shape support structure including:
   a first extension having a first end;
   a second extension having a second end, the second extension is transverse to the first extension;
   a third extension having a third end, the third extension is transverse to the first extension, the third end being opposite to the first end; and
   a fourth extension having a fourth end, the fourth extension is transverse to the second and third extensions;
a first boundary wall structure at the first end;
a second boundary wall structure at the second end;
a third boundary wall structure at the third end;
a fourth boundary wall structure on the fourth extension; and
a hook at the first end, the hook is opposite to the first boundary wall structure.

13. The forking robot of claim 12, further comprising a clamp at the fourth end of the plus-shape support structure.

14. The forking robot of claim 12, wherein the fourth end of the fourth extension is coupled to an articulation structure configured to, in operation, move the plus-shape support structure.

15. A method, comprising:
pulling a shelf within a stocker from a closed position to an opened position utilizing a hook of a forking robot within the stocker;
removing a storage carrier from the shelf utilizing the forking robot to remove the storage carrier from the shelf and support the storage carrier;
transporting the storage carrier to a storage carrier load port within the stocker;
removing a workpiece within a first storage compartment of a production carrier at a production carrier load port with a carrier exchanger;
inserting the workpiece into a second storage compartment of the storage carrier at the storage carrier load port;
transporting the storage carrier containing the workpiece from the storage carrier load port to the shelf;
placing the storage carrier containing the workpiece onto the shelf; and
moving the shelf from the opened position to the closed position to store the storage carrier containing the workpiece within the stocker.

16. The method of claim 15, further comprising transporting the workpiece within the first storage compartment of the production carrier by transporting the production carrier with a production carrier transport system to the production carrier load port of the stocker.

17. The method of claim 15, further comprising opening the production carrier to access the workpiece within the first storage compartment with the production carrier.

18. The method of claim 15, further comprising opening the storage carrier to access the second storage compartment within the storage carrier to insert the workpiece within the second storage compartment of the storage carrier.

19. The method of claim 18, further comprising closing the storage carrier to enclose the workpiece within the second storage compartment of the storage carrier.

20. The method of claim 15, further comprising scanning a radio frequency identification structure on the storage carrier to maintain records of the workpiece within the storage carrier.

\* \* \* \* \*